US010834837B2

(12) United States Patent
Giammaria et al.

(10) Patent No.: US 10,834,837 B2
(45) Date of Patent: Nov. 10, 2020

(54) SYSTEMS AND METHODS FOR MONITOR ATTACHMENT

(71) Applicant: Panasonic Avionics Corporation, Lake Forest, CA (US)

(72) Inventors: Dominic Giammaria, Oceanside, CA (US); Anuj Bhat, Irvine, CA (US)

(73) Assignee: Panasonic Avionics Corporation, Lake Forest, CA (US)

( * ) Notice: Subject to any disclaimer, the term of this patent is extended or adjusted under 35 U.S.C. 154(b) by 0 days.

(21) Appl. No.: 16/354,807

(22) Filed: Mar. 15, 2019

(65) Prior Publication Data

US 2020/0296847 A1    Sep. 17, 2020

(51) Int. Cl.
    B60R 11/02    (2006.01)
    H05K 5/02    (2006.01)
    A47B 81/06    (2006.01)

(52) U.S. Cl.
CPC ......... H05K 5/0226 (2013.01); A47B 81/065 (2013.01); H05K 5/0204 (2013.01); H05K 5/0221 (2013.01)

(58) Field of Classification Search
CPC ........ B60R 11/0235; B60R 2011/0078; B64D 11/00151; B64D 11/00152
See application file for complete search history.

(56) References Cited

U.S. PATENT DOCUMENTS

| | | | |
|---|---|---|---|
| 5,145,128 A | 9/1992 | Umeda | |
| 5,831,820 A | 11/1998 | Huang | |
| 7,780,231 B2 * | 8/2010 | Shalam | B60R 11/0235 297/217.3 |
| 8,540,309 B2 * | 9/2013 | Berger | B64D 11/0638 297/163 |
| 9,360,895 B2 | 6/2016 | Shah et al. | |
| 9,695,972 B1 | 7/2017 | Jiang et al. | |
| 9,880,962 B2 * | 1/2018 | Tuccinardi | G06F 13/4081 |
| 9,945,509 B2 | 4/2018 | Barnes et al. | |
| 10,173,605 B2 * | 1/2019 | Carswell | B64D 11/00152 |
| 10,315,766 B2 * | 6/2019 | Yokota | B60R 11/0235 |

(Continued)

OTHER PUBLICATIONS

U.S. Appl. No. 15/894,551, filed Feb. 12, 2018.

(Continued)

*Primary Examiner* — Bradley Duckworth
(74) *Attorney, Agent, or Firm* — Klein, O'Neill & Singh, LLP

(57) ABSTRACT

An attachment system for use in mounting a monitor to a fixture. The system includes a monitor housing that houses a monitor and a fixture housing that attaches to a fixture, where the monitor housing mounts to a recess within the fixture housing. The fixture housing has a hinged tongue-groove joint that allows the monitor housing to engage and disengage with the hinged joint at an installation angle, but does not allow the monitor housing to disengage from the fixture housing at an installed angle. In the engaged position, the monitor housing can rotate relative to the fixture housing via the hinged tongue-groove joint, and can be locked in position to prevent rotation using a locking mechanism. The hinged tongue-groove joint can be tapered to improve self-alignment during installation, and can be configured to elastically compress in the installed angle to minimize movement when installed.

20 Claims, 19 Drawing Sheets

(56) References Cited

U.S. PATENT DOCUMENTS

| | | | |
|---|---|---|---|
| 2004/0068985 A1 | 4/2004 | Mernoe | |
| 2006/0087142 A1* | 4/2006 | Lu | B60R 11/0235 |
| | | | 296/37.7 |
| 2006/0175879 A1* | 8/2006 | Chiang | B60R 11/0235 |
| | | | 297/188.04 |
| 2012/0063081 A1 | 3/2012 | Grunwald | |
| 2016/0039525 A1 | 2/2016 | Pajic | |
| 2016/0152340 A1 | 6/2016 | Bauer et al. | |
| 2018/0148173 A1 | 5/2018 | Schwartz et al. | |
| 2019/0225338 A1* | 7/2019 | Pozzi | B64D 11/00152 |
| 2019/0283369 A1* | 9/2019 | Thompson | B32B 27/365 |
| 2020/0055460 A1* | 2/2020 | Morales | B60R 11/0235 |

OTHER PUBLICATIONS

"Technical Characteristics of Flexinol Actuator Wires", Dynalloy, Inc., F1140 Rev 1.2, pp. 1-12.

Office Action dated Sep. 5, 2019 from USPTO for related U.S. Appl. No. 15/894,551.

Notice of Allowance dated Jan. 2, 2020 from USPTO for related U.S. Appl. No. 15/894,551.

Office Action dated May 29, 2020 from USPTO for related U.S. Appl. No. 16/737,159.

Notice of Allowance dated Jul. 15, 2020 from USPTO for related U.S. Appl. No. 16/737,159.

\* cited by examiner

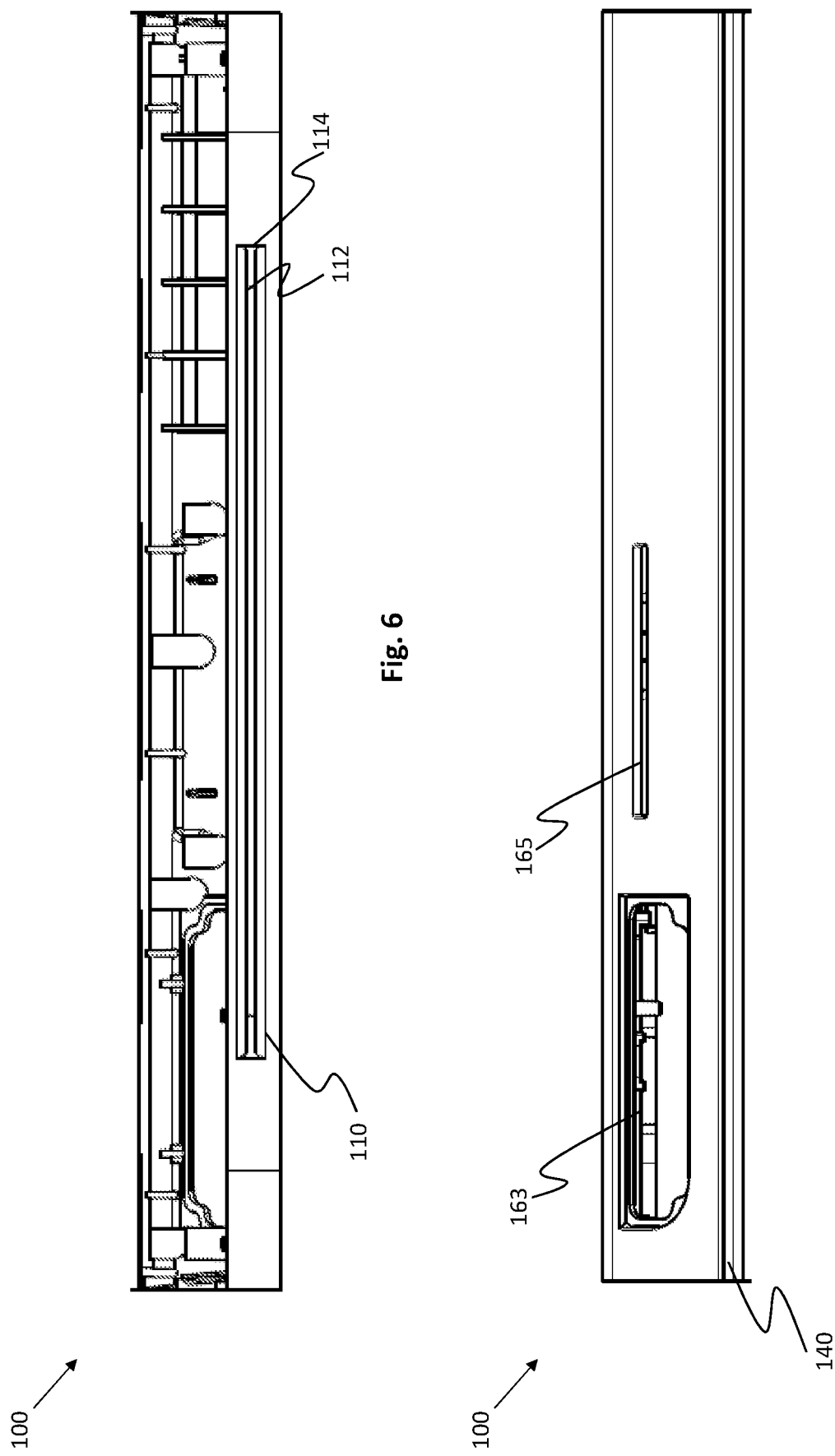

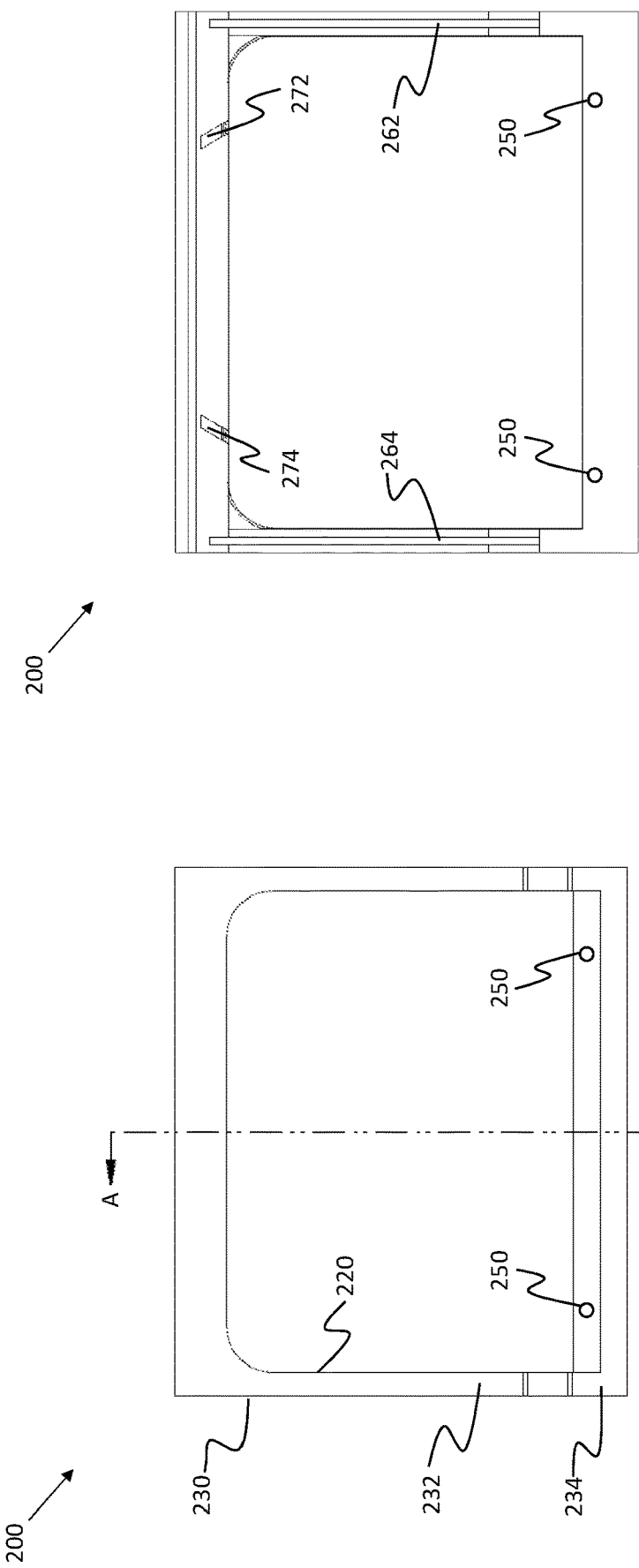

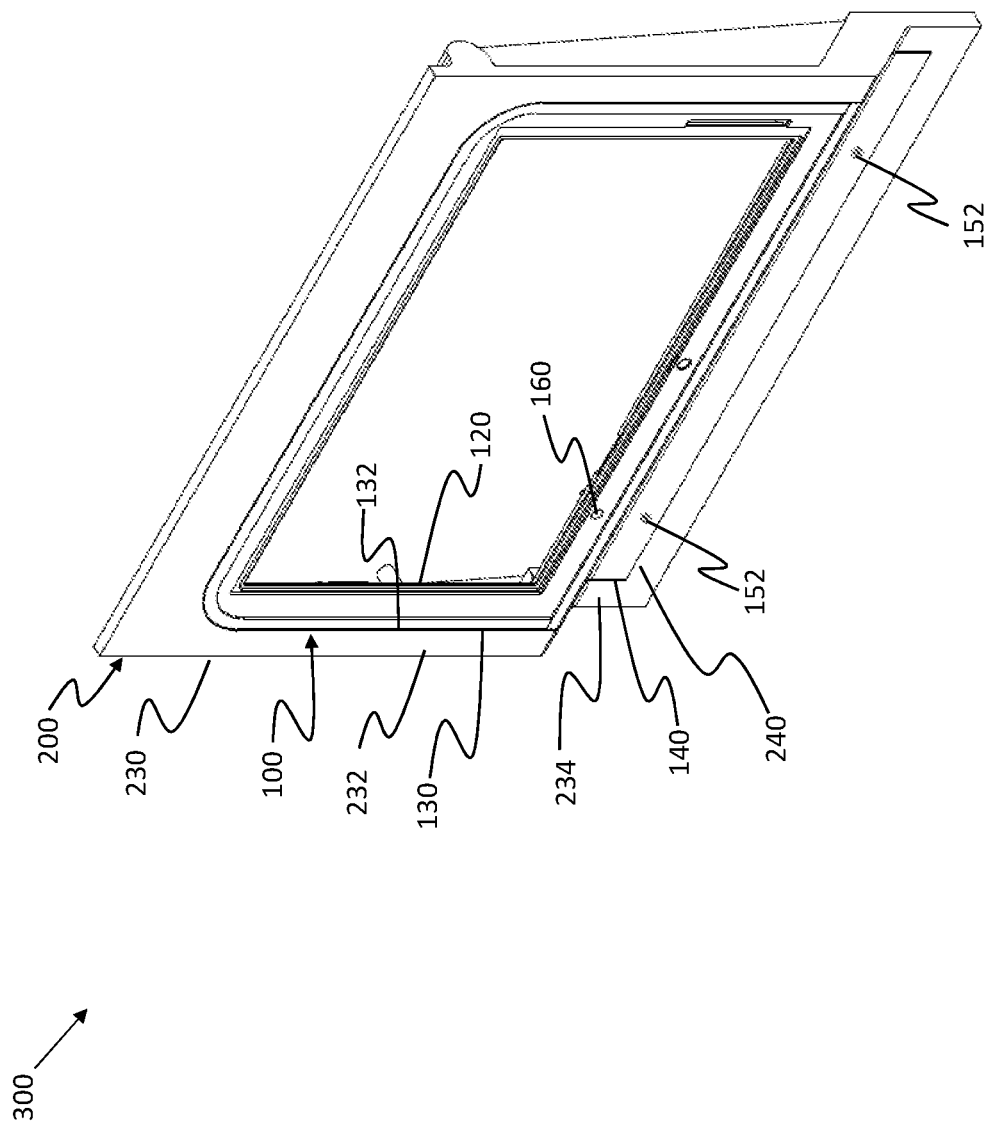

SYSTEMS AND METHODS FOR MONITOR ATTACHMENT

TECHNICAL FIELD

The present disclosure relates to methods and systems for installing and uninstalling displays and monitor systems to a fixture.

BACKGROUND

It is common to have video monitors attached to fixtures, for example to a structure within a transportation vehicle or to a wall in a building. An information/entertainment display system may be fastened to the rear of a seat of a transportation vehicle, for instance, an airplane seat in an aircraft for use by a passenger. Sometimes, a display system must be removed from the support structure or fixture for service, repair, and/or replacement. To remove the display system from installation in the fixture or support structure, a seat cover and/or other portions of the seat such as cushioning may need to be removed from the seat to obtain access to fasteners holding the display system in place. In addition, the fasteners may require special and expensive tools to release the display system.

In commercial passenger transport applications, the turn-around time for repairing or replacing a display system is a significant consideration, particularly, for example, if airline passengers are waiting for maintenance to complete before the flight is able to take off. As such, continuous efforts are being made to develop better systems for fastening a display system to a fixture or support structure that provide quicker and/or easier release and for access that does not require disassembling all or a portion of the fixture or supporting structure.

BRIEF DESCRIPTION OF THE DRAWINGS

The various features of the present disclosure will now be described with reference to the drawings of the various aspects disclosed herein. In the drawings, the same components may have the same reference numerals. The illustrated aspects are intended to illustrate, but not to limit the present disclosure. The drawings include the following Figures:

FIG. 6 shows a top view of the monitor housing of FIG. 1, according to one aspect of the present disclosure;

FIG. 7 shows a bottom view of the monitor housing of FIG. 1, according to one aspect of the present disclosure;

FIG. 9 shows a front view of the fixture housing of FIG. 8, according to one aspect of the present disclosure;

FIG. 10 shows a rear view of the fixture housing of FIG. 8, according to one aspect of the present disclosure;

FIG. 29 shows the monitor housing of FIG. 1 installed within the fixture housing of FIG. 8, according to one aspect of the present disclosure;

DETAILED DESCRIPTION

The detailed description set forth below in connection with the appended drawings is intended as a description of systems and methods for attaching a monitor to a fixture in accordance with the various aspects of the present disclosure and is not intended to represent the only forms in which the present disclosure may be constructed or utilized. The description sets forth the features and the steps for constructing and using the systems and methods for attaching a monitor to a fixture. It is to be understood, however, that the same or equivalent functions and structures may be accomplished by different aspects that are also intended to be encompassed within the spirit and scope of the present disclosure defined by the appended claims.

Figure 1:
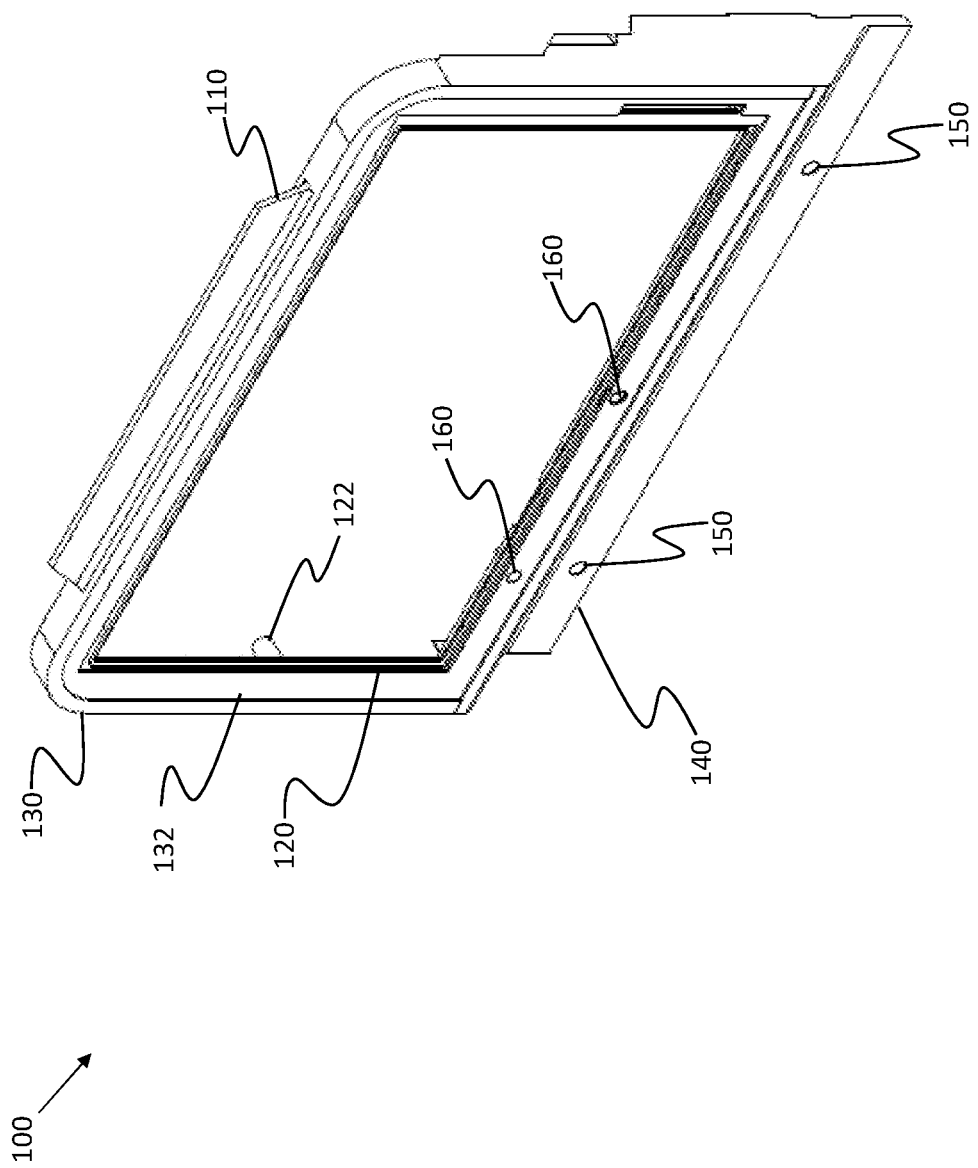
FIG. 1 shows a perspective view of a monitor housing without a monitor installed, according to one aspect of the present disclosure.

In one aspect, innovative technology for coupling a monitor to a fixture is disclosed herein. One innovative coupling system (300, FIG. 29) of the present disclosure includes a monitor housing (100, FIG. 1) and a fixture housing (200, FIG. 8).

Figure 14:
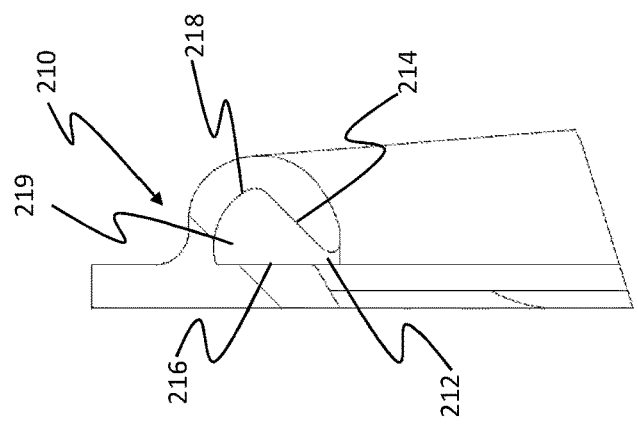
FIG. 14 shows a zoomed-in view of the female hinged groove of FIG. 13 within section B, according to one aspect of the present disclosure.
Figure 13:
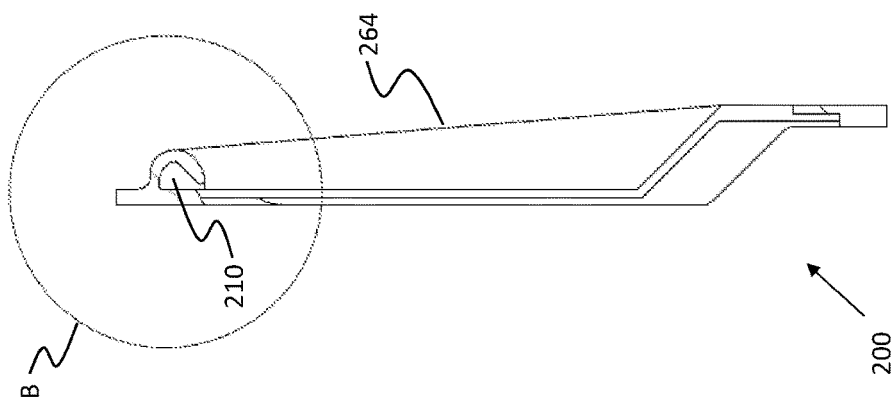
FIG. 13 shows a right cross-sectional view of the fixture housing of FIG. 9 across the cross-section marked A in FIG. 9, according to one aspect of the present disclosure.
Figure 12:
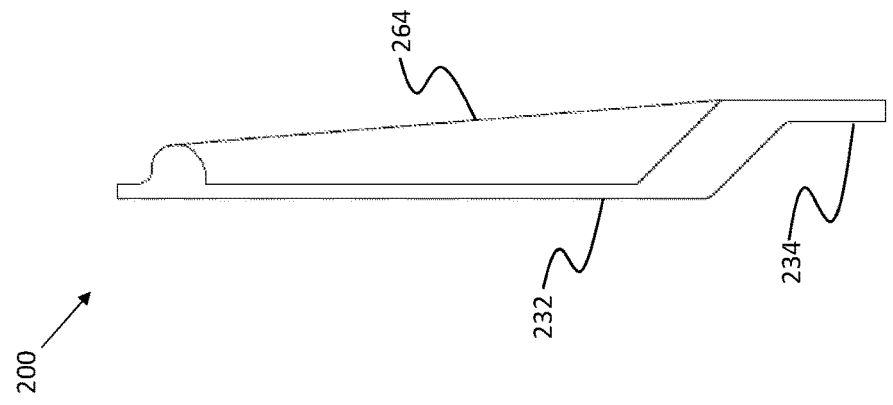
FIG. 12 shows a right view of the fixture housing of FIG. 8, according to one aspect of the present disclosure.
Figure 26:
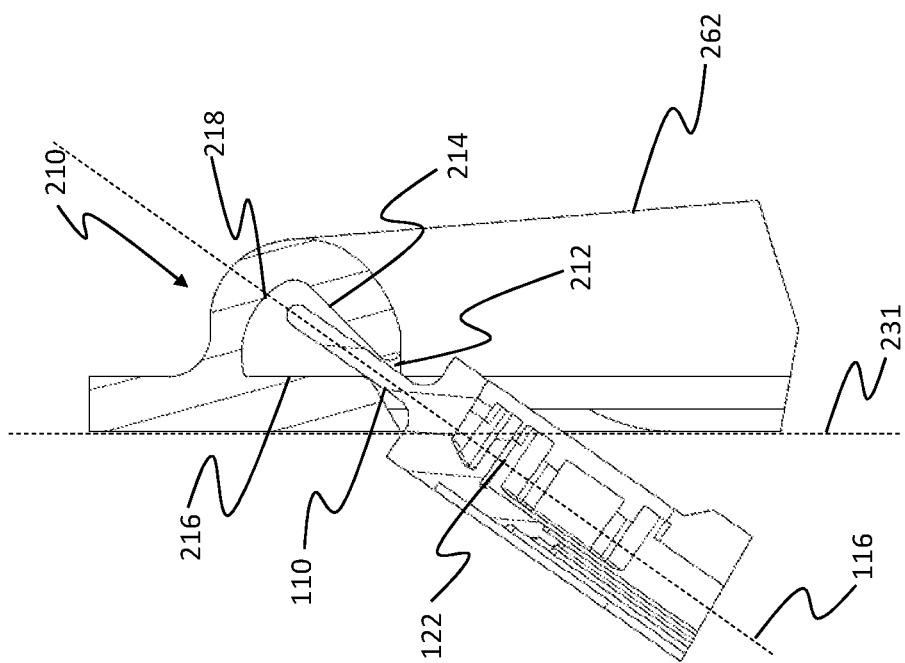
FIG. 26 shows a zoomed-in view of the female hinged groove and the tongue of FIG. 25 within the section marked F in FIG. 25, according to one aspect of the present disclosure.
Figure 25:
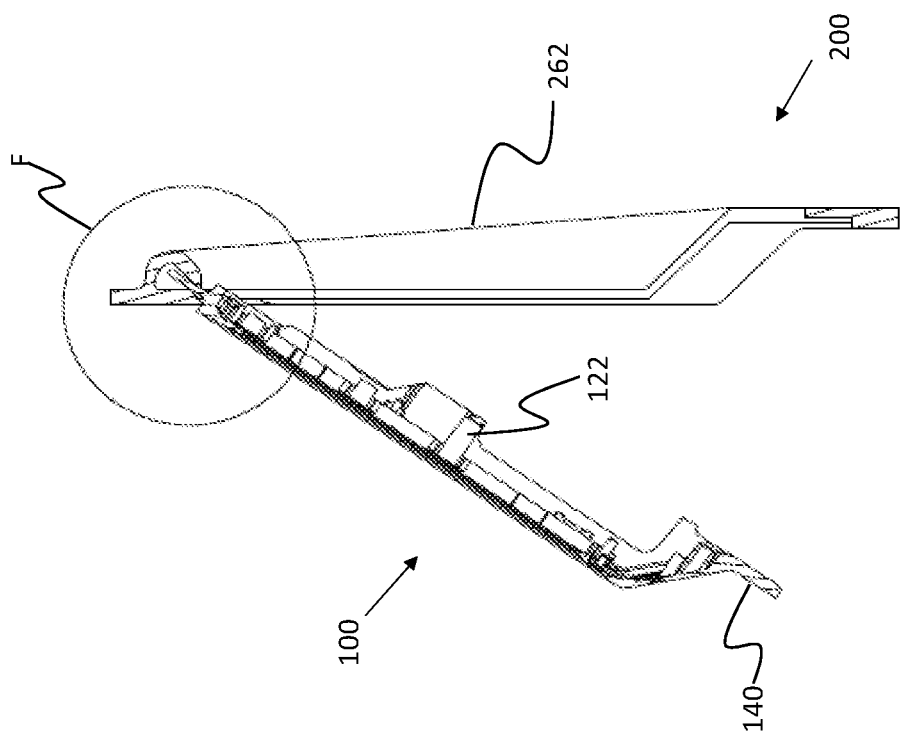
FIG. 25 shows a right cross-sectional view of the monitor housing and fixture housing of FIG. 23 across the cross-section marked E in FIG. 23, according to one aspect of the present disclosure.
Figure 28:
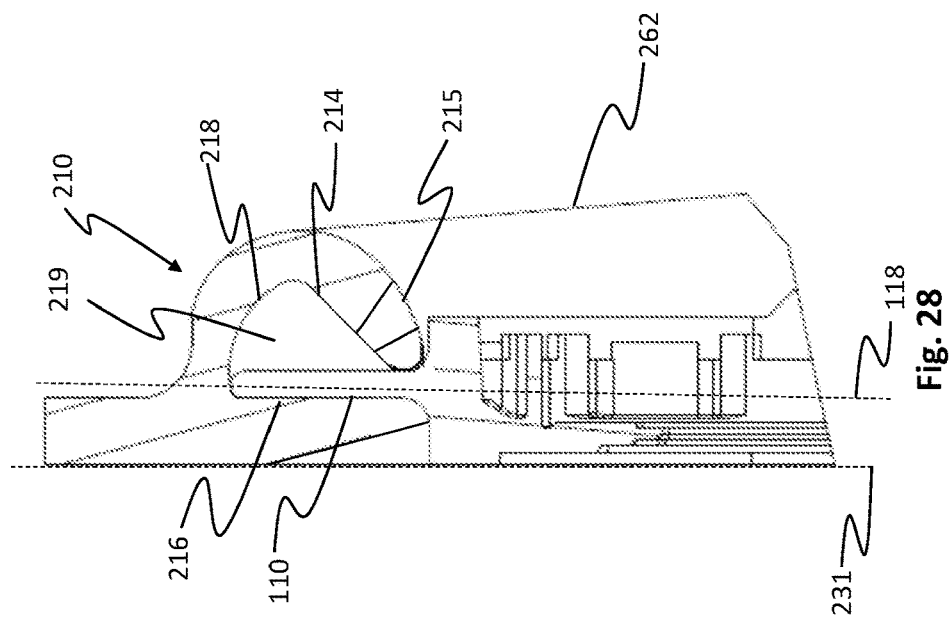
FIG. 28 shows the zoomed-in view of FIG. 26, where the monitor housing has been rotated to the installed angle, and where a rear portion of the female hinged groove is compressed by the tongue, according to one aspect of the present disclosure.
Figure 27:
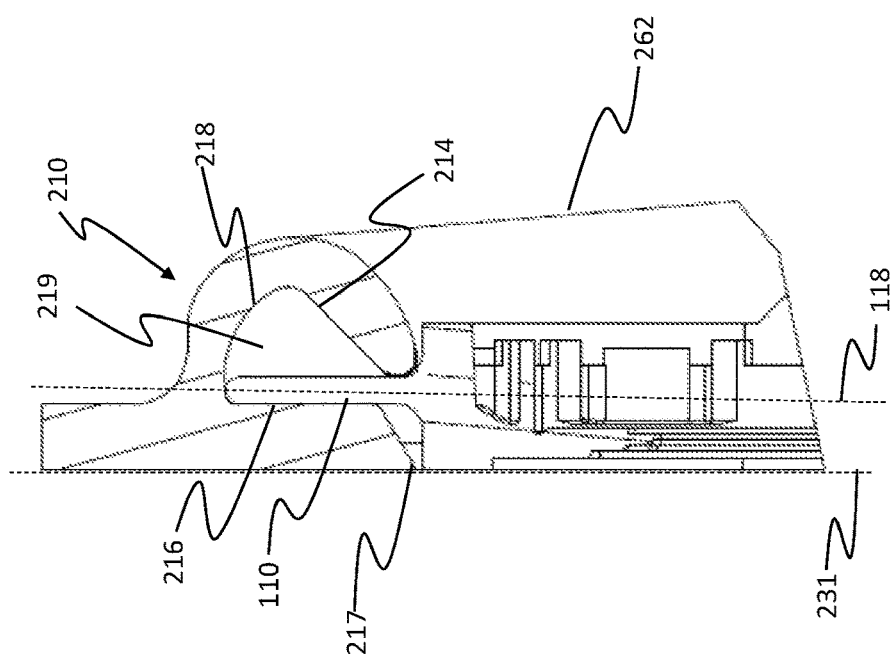
FIG. 27 shows the zoomed-in view of FIG. 26, where the monitor housing has been rotated to the installed angle, and where a front portion of the female hinged groove is compressed by the tongue, according to one aspect of the present disclosure.

The monitor housing (100, FIG. 1) includes a tongue (110, FIG. 1) defined by the housing. The fixture housing (200, FIG. 8) includes a hinged groove joint (210, FIG. 13) configured to receive tongue 110, as shown in FIG. 26. As used herein a "hinged groove joint" comprises both the groove and the material that defines the groove. Tongue 110 is configured to rotate within hinged groove joint 210 between an installation angle shown in FIG. 26 and an installed angle shown in FIG. 27. Hinged groove joint 210 has an opening (212, FIG. 14) having a width perpendicular to the installation angle that is greater than a width of tongue 110, and a width perpendicular to the installed angle that is less than a width of tongue 110, as shown in FIGS. 26-28. This ensures that when tongue 110 rotates from the installation angle to the installed angle, at least one portion of hinged groove joint 210 applies compressive forces against tongue 110 to hold it in place. Preferably, when monitor housing 100 is rotated to the installed angle, the front surface (132, FIG. 1) of monitor housing 100 is flush with the front surface (232, FIG. 8) of fixture housing 200. Generally both of the front surfaces are juxtaposed to one another when monitor housing 100 is rotated to the installed position, to create a flush-mount look.

For example, in some embodiments, the front wall portion (217, FIG. 27) may flex to apply a compressive force against tongue 110, and in other embodiments the rear wall portion (215, FIG. 28) may flex to apply a compressive force against tongue 110. Tongue 110 may be manufactured out of a material that has equal or a higher tensile modulus than the material that composes hinged groove joint 210. As used herein, the terms "tensile modulus" are used interchangeably with "young's modulus" and "modulus of elasticity." Materials with a lower tensile modulus are more elastic than materials with a higher tensile modulus. Notches (274, FIG. 10) may also be cut on either, or both, sides of hinged groove joint 210 to encourage flexion of hinged groove joint 210 when tongue 110 rotates within hinged groove joint 210. The entire upper edge, or even the entirety of, monitor housing 100 may be made from a material having an equal or higher tensile modulus than the entire upper edge, or even the entirety of, fixture housing 200.

Figure 2:
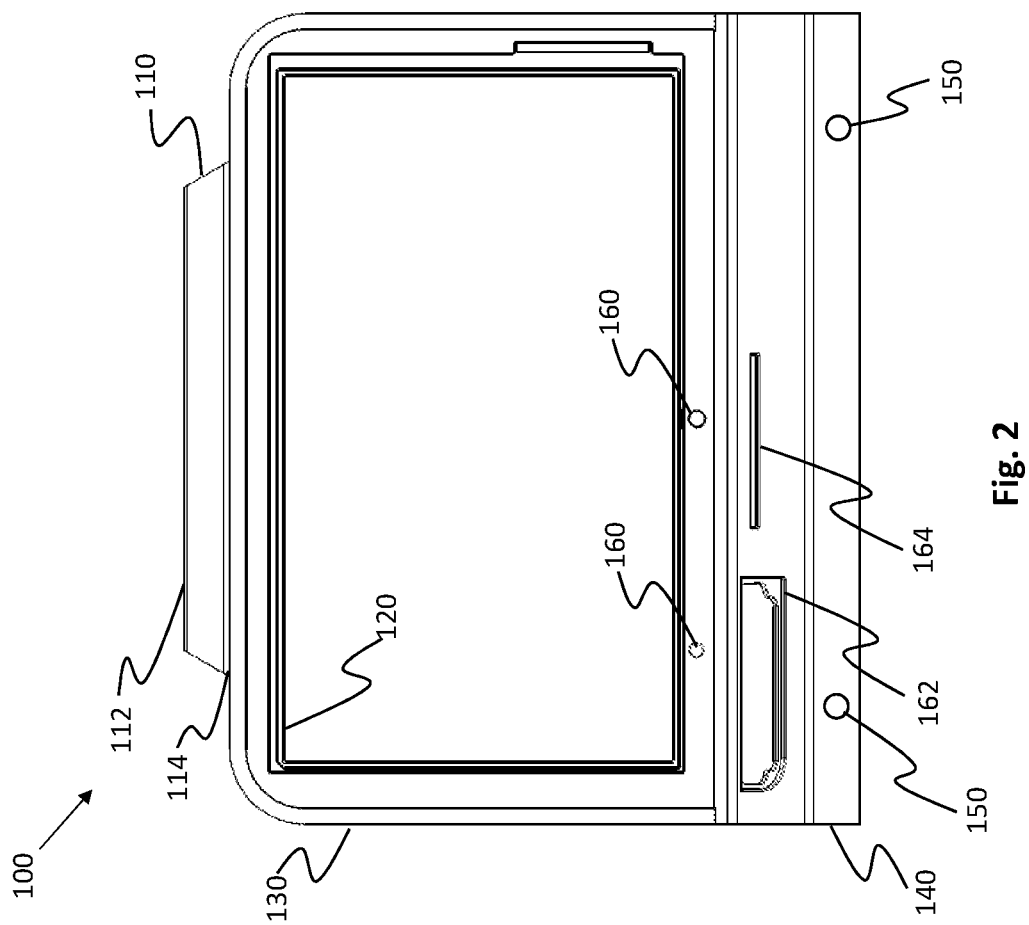
FIG. 2 shows a front view of the monitor housing of FIG. 1, according to one aspect of the present disclosure.

Hinged groove joint 210 and tongue 110 may have one or more matching tapered edges to help tongue 110 self-align when being inserted into hinged groove joint 210. For example, the width of the tip (112, FIG. 2) of tongue 110 may be smaller than the width of the base (114, FIG. 2) of tongue 110, and both sides of tongue 110 may be tapered between the tip and the base. The interior of hinged groove joint 210 should preferably match the taper, as shown in FIG. 10.

Hinged groove joint 210 and tongue 110 act together to present a hinged joint assembly which improves the alignment and provides rapid engagement/disengagement of monitor housing 100 with fixture housing 200 via the user-friendly hinged joint assembly. By shaping hinged groove joint 210 thusly relative to tongue 110, the fixture hinged joint assembly is configured to enable engagement and disengagement of monitor housing 100 with fixture housing 200 at an installation angle relative to one another. This arrangement also prevents disengagement of monitor housing 100 and fixture housing 200 at an installed angle relative to one another, and is configured to enable rotation of monitor housing 100 relative to fixture housing 200 between the installation angle and the installed angle.

The fixture housing (200, FIG. 8) also includes a monitor housing recess (220, FIG. 8) configured to receive monitor housing 100, as shown in FIG. 29. The outer perimeter portion (130, FIG. 1) of monitor housing 100 is configured to fit within monitor housing recess 220 along an inner perimeter portion (220, FIG. 8) when tongue 110 is rotated to the installed angle. Fixture housing 200 also preferably has at least one reinforcement rib (262, FIG. 8) along an axis (239, FIG. 8) to increase the strength of fixture housing 200 along that axis relative to the strength of fixture housing 200 along an axis perpendicular (238, FIG. 8) to the reinforcement rib. This ensures that, if a compressive force is applied to the face of fixture housing 200, fixture housing 200 will be encouraged to bend along one axis and not the other, while also encouraging flexing in the specifically designed hinged joint area and not any other area on the fixture housing.

A locking mechanism has a locked state that prevents tongue 110 from rotating from the installed angle to the installation angle, and an unlocked state that allows the tongue to rotate from the installed angle to the installation angle. The locking mechanism is preferably disposed on a side of fixture housing 200 opposite hinged groove joint 210 and on a side of monitor housing 100 opposite tongue 110. For example, the locking mechanism can be embodied as screws (152, FIG. 29), monitor housing threaded holes (150, FIG. 1), and fixture housing threaded holes (250, FIG. 8) along the bottom edges of monitor housing 100 and fixture housing 200. When screws 152 are screwed through monitor housing threaded holes 150 and fixture housing threaded holes 250, the locking mechanism is placed in the locked state to prevent tongue 110 from rotating within hinged groove joint 210. When screws 152 are removed from monitor housing threaded holes 150 and fixture housing threaded holes 250, the locking mechanism is placed in the unlocked state, which allows tongue 110 to rotate within hinged groove joint 210.

Figure 3:
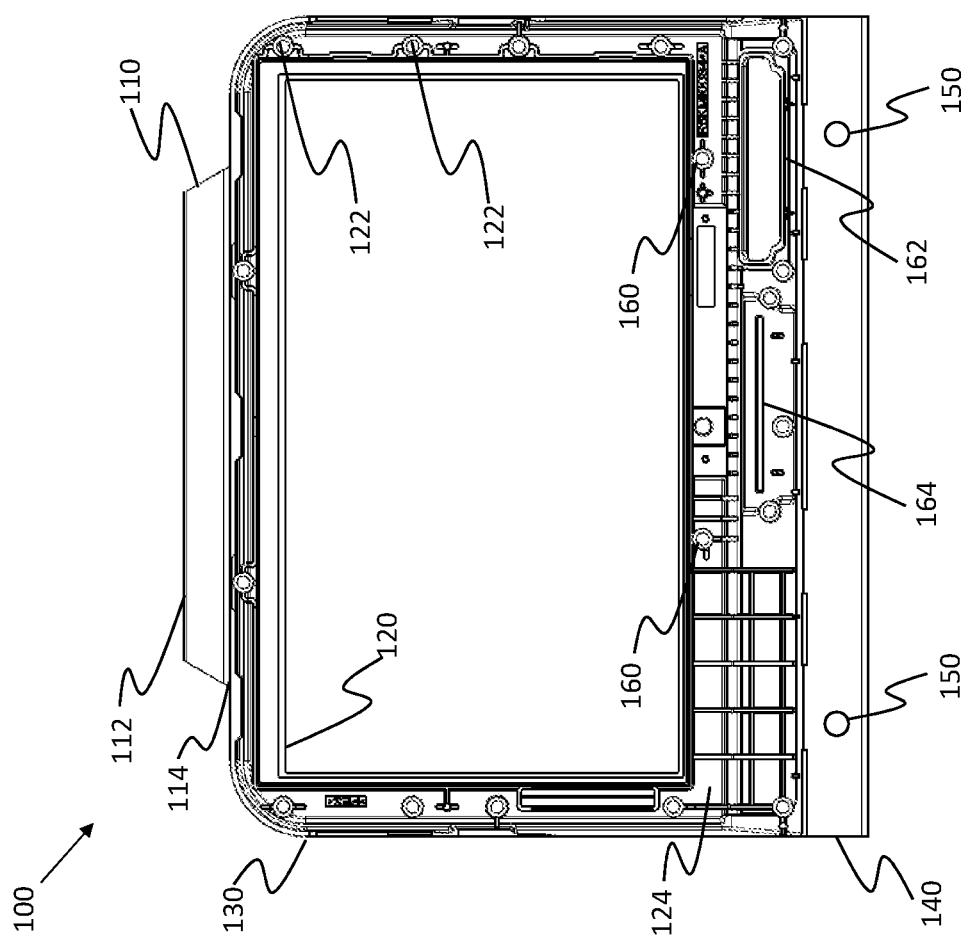
FIG. 3 shows a rear view of the monitor housing of FIG. 1, according to one aspect of the present disclosure.
Figure 5:
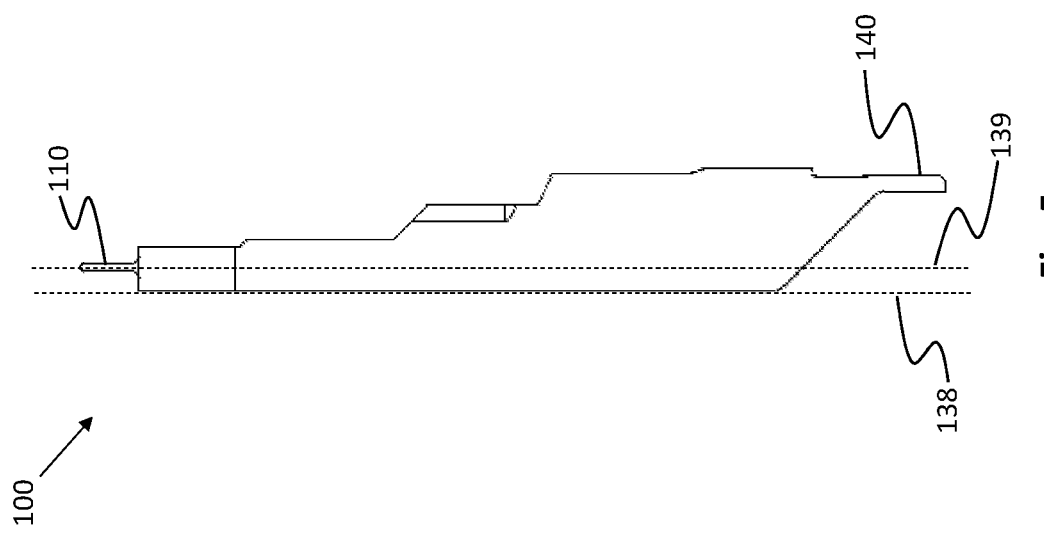
FIG. 5 shows a right view of the monitor housing of FIG. 1, according to one aspect of the present disclosure.
Figure 4:
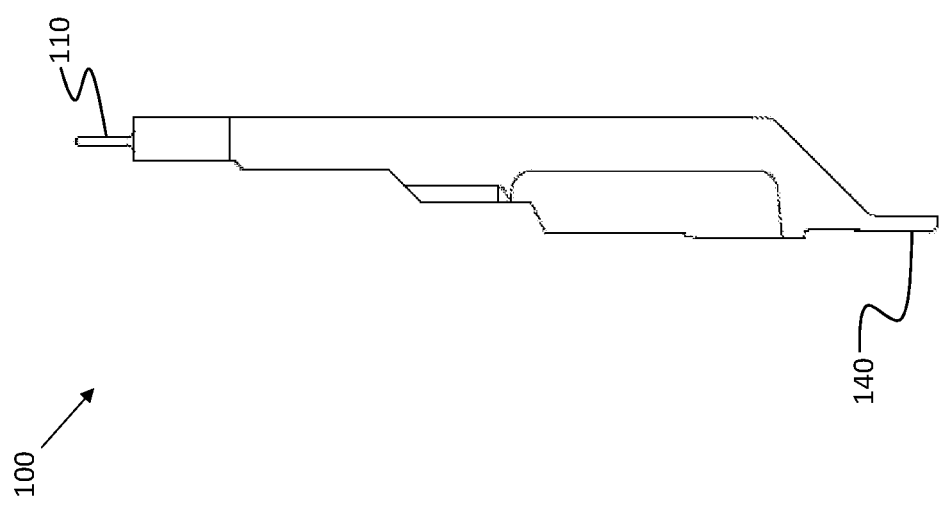
FIG. 4 shows a left view of the monitor housing of FIG. 1, according to one aspect of the present disclosure.

Monitor housing 100 has at least one monitor attachment mechanism that allows an installer to couple a monitor, such as a flat screen display, to the monitor housing. For example, the monitor attachment mechanism could be embodied by threaded screw holes (122, FIG. 3) on a rear side of monitor housing 100, which could be used to couple a monitor (not shown) to monitor housing 100 using screws similar to screws 152. Screw holes 122 are placed on multiple sides of monitor housing 100 to improve the stability of the connection.

Figure 30:
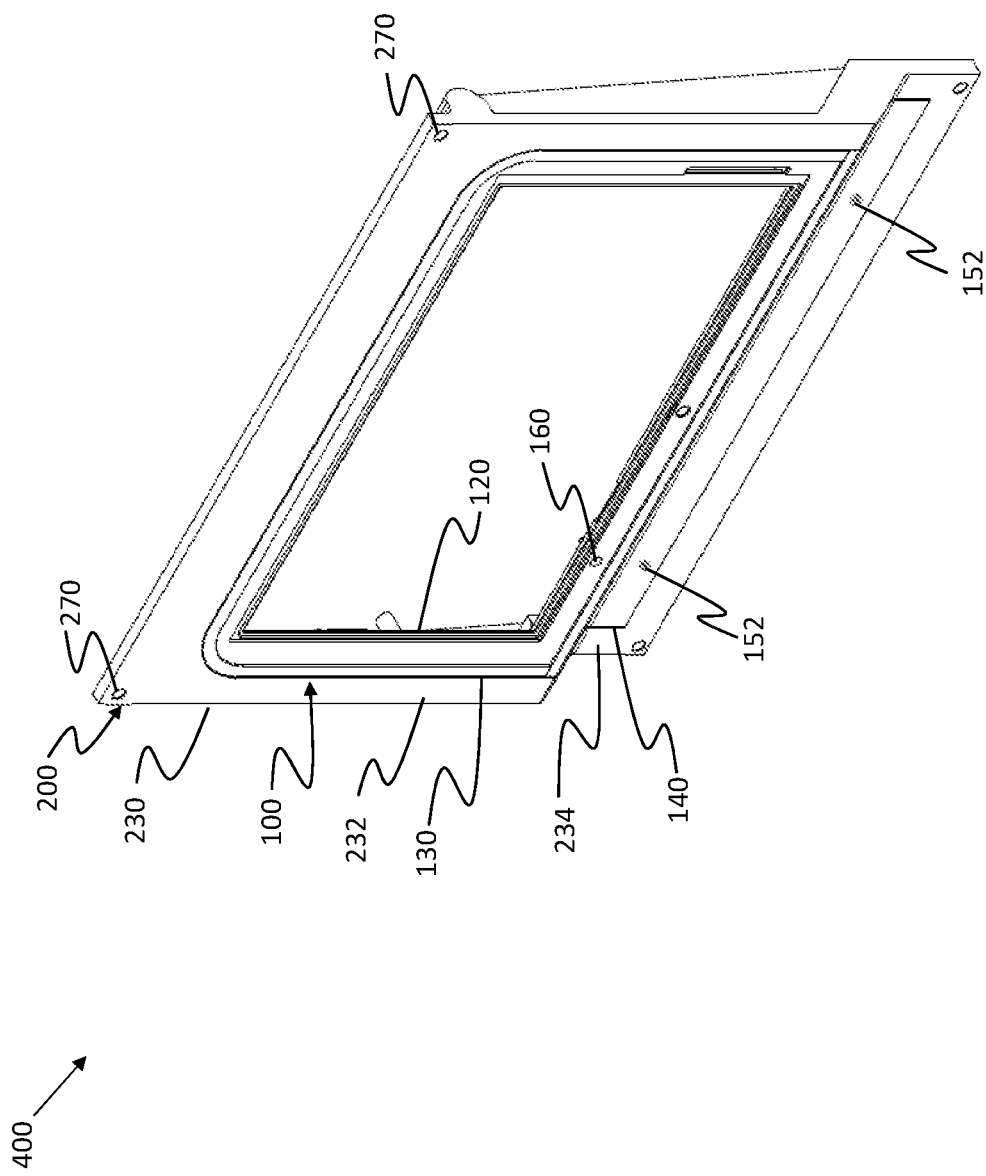
FIG. 30 shows the monitor housing of FIG. 1 installed within an alternative fixture housing having an attachment mechanism to attach the fixture housing to a fixture, according to one aspect of the present disclosure.

Fixture housing 200 also has at least one fixture attachment mechanism that allows an installer to couple fixture housing 200 to a fixture, such as a chair of an airplane or a wall of a building. For example, the fixture attachment mechanism could be embodied by threaded screw holes (270, FIG. 30), which could be used to couple fixture housing 200 to a fixture (not shown) using screws similar to screws 152. Screw holes 270 are placed on both sides of fixture housing 200 to improve the stability of the connection.

Screws utilized in the installation, particularly screws 152 utilized to lock monitor housing in place, preferably have a proprietary head to prevent casual users from easily unlocking the monitor. For example, the screw heads could have a shape or a # shape, or could be shaped to any logo or configuration other than standard Philips and Slot screwdriver heads commonly available on the market.

Alternatively, non-standard screw head types could be used that are off the shelf but not commonly known to passengers, for example, tamper resistant TORX or Hex head screws available from McMaster-Carr of Santa Fe Springs, Calif., USA, and other companies.

Using such embodiments of the innovative technology, an installer could rapidly decouple monitors to a fixture via hinged groove joints. The most time-consuming part of installation would generally be coupling the monitor to the monitor housing and coupling the fixture housing to the fixture. Once this step is completed, an installer could rapidly couple the monitor housing to the fixture housing by inserting the tongue of the monitor housing into the hinged groove joint of the fixture housing at an installation angle, rotate the monitor housing from the installation angle to the installed angle within the hinged groove joint, and lock a locking mechanism to prevent the monitor housing from rotating from the installed angle to the installation angle. Broken monitors could be rapidly replaced with by replacing the monitor housing coupled to the broken monitor with a monitor housing coupled to a working monitor.

Monitor Housing 100:

FIGS. 1-7 show an example of an exemplary monitor housing 100 having a monitor recess 124 in which a monitor (not shown) is coupled to monitor housing 100, portions of which are viewable through windows 120 and 160, respectively. As used herein, the term "monitor" is used to refer to any display system having a visual display, for example a flat screen, a tablet, a smart television system, or a non-smart type of display. In one aspect, the monitor installed in monitor housing 100 could be a complex display system, which may be used to access seat functions and entertainment/informational content on transportation vehicles that use various computing devices for providing various functions, including entertainment, system control, content storage, and other functions.

The monitor could be coupled to monitor housing 100 in any suitable manner, for example coupled to threaded screw holes 122 disposed about the window 120. While fourteen threaded screw holes 122 are shown, more or less screw holes could be used to couple a monitor to monitor housing 100. Other attachment means could be used to couple a monitor to monitor housing 100, for example adhesives, pins, tabs, snaps, nails, or nuts and bolts. The attachment material or hardware used is preferably reversible to minimize damage to the monitor when removing the monitor from monitor housing 100. For example, the wear and tear that threaded screw holes 122 suffer during normal installation and removal of a monitor from monitor housing 122 is so minimal that the process can typically be repeated hundreds of times without affecting the fundamental structure of threaded screw holes 122.

Monitor housing 100 has windows 160 that allow a user to view indicator lights and LEDs in an installed monitor, front ports 162 and 164 that allow a user to access hardware of the installed monitor, such as a credit-card reader, a USB port, or a headphone/audio jack, and lower ports 163 and 165 that allow hardware of the installed monitor to couple with terminals in a fixture. While windows 120 and 160 are shown as holes formed in monitor housing 100, any of windows 120 and 160 could have a translucent or a transparent material covering the hole to allow a user to view display components of the installed monitor, such as the screen of the monitor or a status light of the monitor. Interior tunnels (not shown) connect front port 162 with lower port 163 and front port 164 with lower port 165, allowing for hardware ports to access one another on different sides of monitor housing 100. Although front ports 162 and 164 are located on a front bottom side of monitor housing 100 and lower ports 163 and 165 are located on a bottom side of monitor housing 100, the ports may be placed any suitable area along monitor housing 100 depending upon need.

Monitor housing 100 has a tongue 110, which is embodied as a tapered tongue extending at an angle 139 parallel to an angle 138 of major front surface 132 of monitor housing 100, however tongue 110 could be sized and shaped in any suitable manner to rotate within a matching hinged groove joint. For example, tongue 110 could be shaped without a taper, could be angled forwards or backwards, could be curved, or could even be configured to extend from any other surface of monitor housing 100, for example the bottom surface or a rear surface. While only a single tongue 110 is disclosed, a plurality of tongues could extend from an edge of monitor housing 100, mating with a plurality of matching hinged groove joints that act together as rotational hinge points for monitor housing 100 to rotate. Preferably, tongue 110 is sized and disposed with at least one tapered surface on an upper edge of monitor housing 100 to provide for an intuitive connection point.

Monitor housing 100 is preferably injection-molded from any lightweight, rigid material, for example plastic, but could be manufactured in any suitable manner, for example via 3-D printing, casting, machining or via assembly from discrete components. As shown, monitor housing 100 is substantially rectangular to conform to a monitor of a substantially rectangular shape, but monitor housing 100 could be formed in any suitable size and shape depending upon the type and functionality of the monitor installed within monitor housing 100. Preferably, monitor housing 100 is shaped to conform to a screen of a monitor for aesthetic reasons.

Fixture Housing 200:

FIGS. 8-16 show an example of an exemplary fixture housing 200 having a monitor housing recess 220 configured to hold monitor housing 100. Preferably, fixture housing 200 is configured to hold monitor housing 100 such that a front surface 232 of fixture housing 200 is flush with the front surface 132 of monitor housing 100 when monitor housing 100 is installed within monitor housing recess 220. Such flush-mount systems are typically more aesthetically pleasing than non-flush-mount systems.

Figure 8:
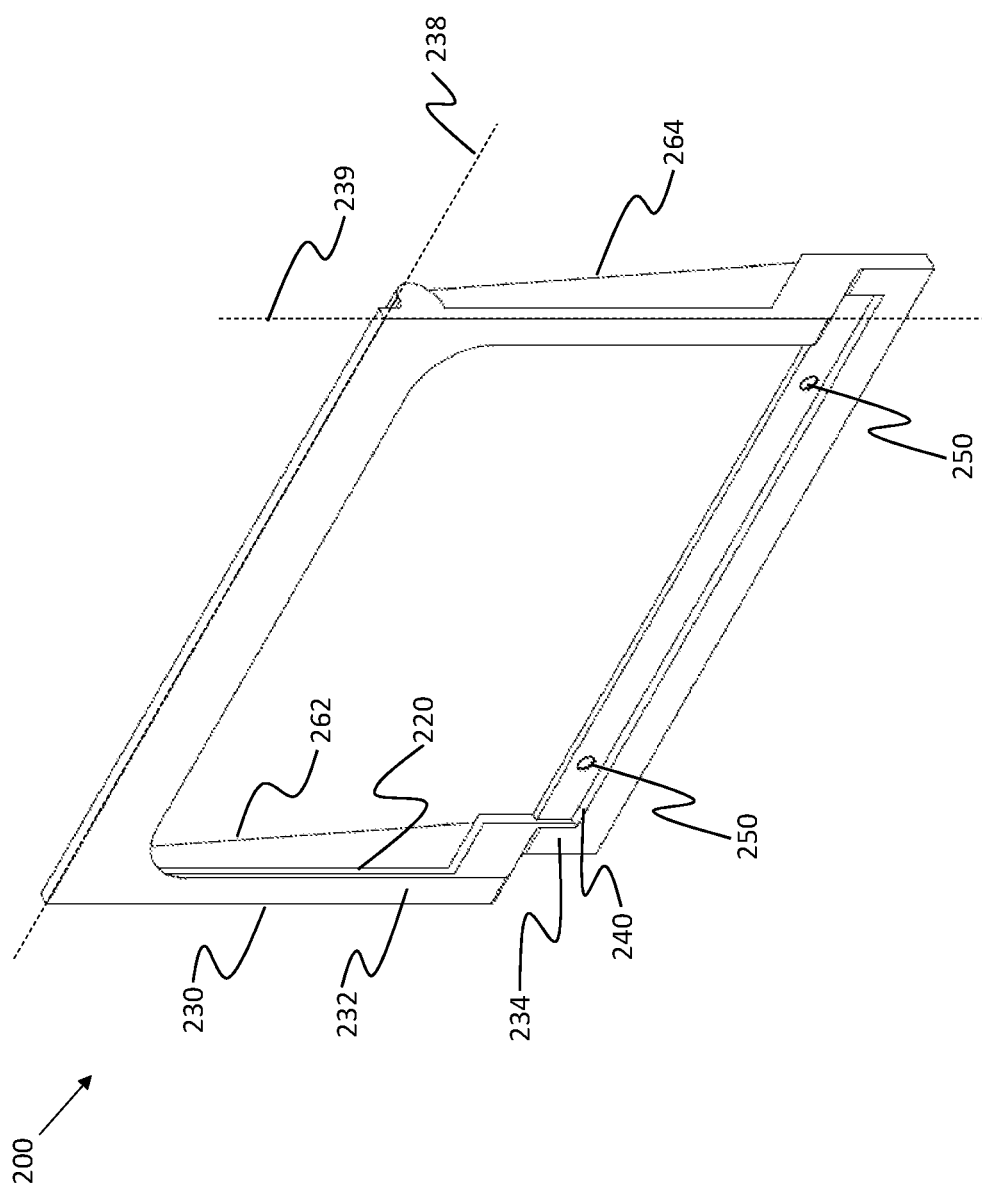
FIG. 8 shows a perspective view of a fixture housing, according to one aspect of the present disclosure.
Figure 11:
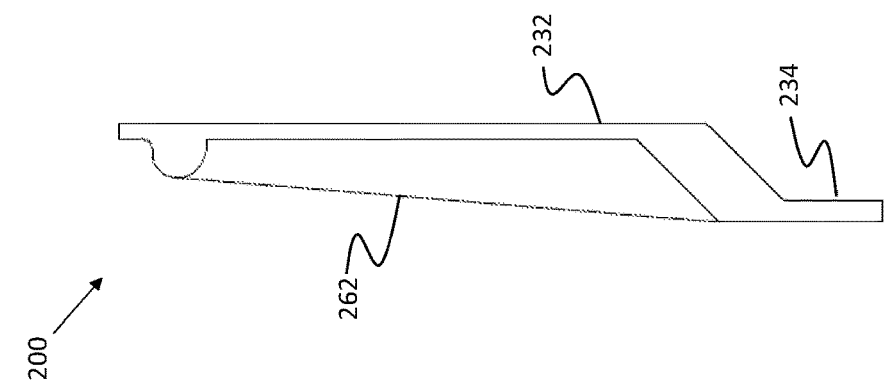
FIG. 11 shows a left view of the fixture housing of FIG. 8, according to one aspect of the present disclosure.
Figure 15:
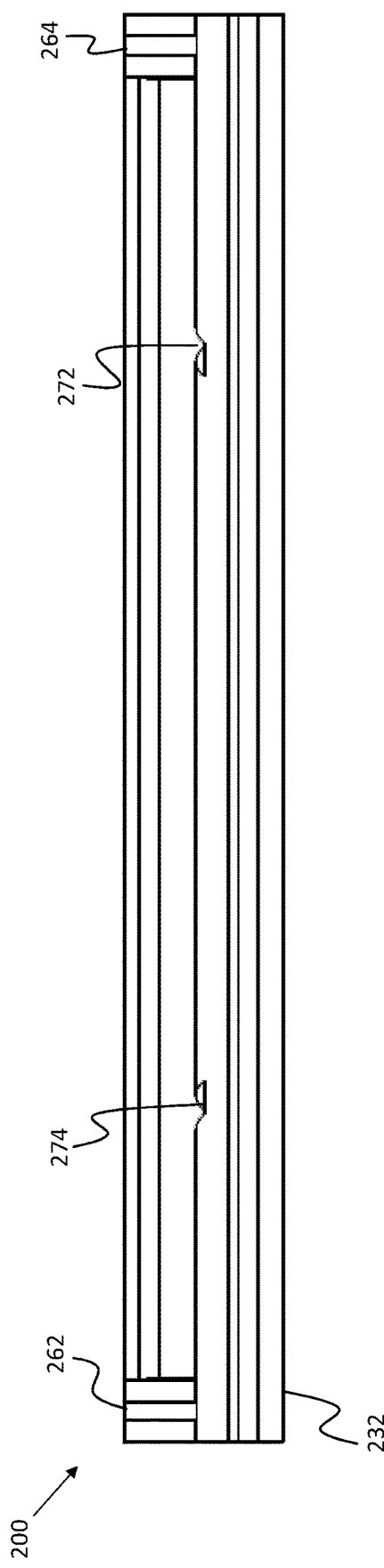
FIG. 15 shows a top view of the fixture housing of FIG. 8, according to one aspect of the present disclosure.
Figure 16:
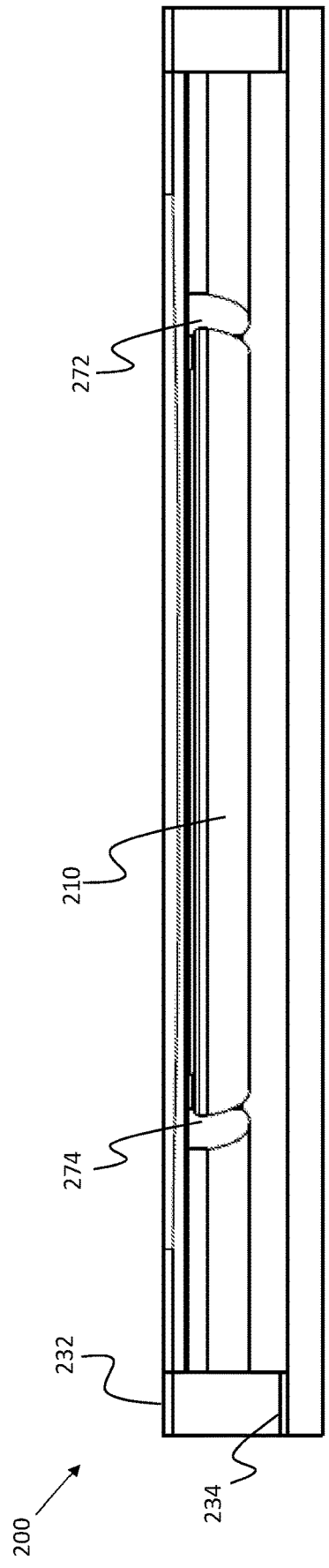
FIG. 16 shows a bottom view of the fixture housing of FIG. 8, according to one aspect of the present disclosure.
Figure 18:
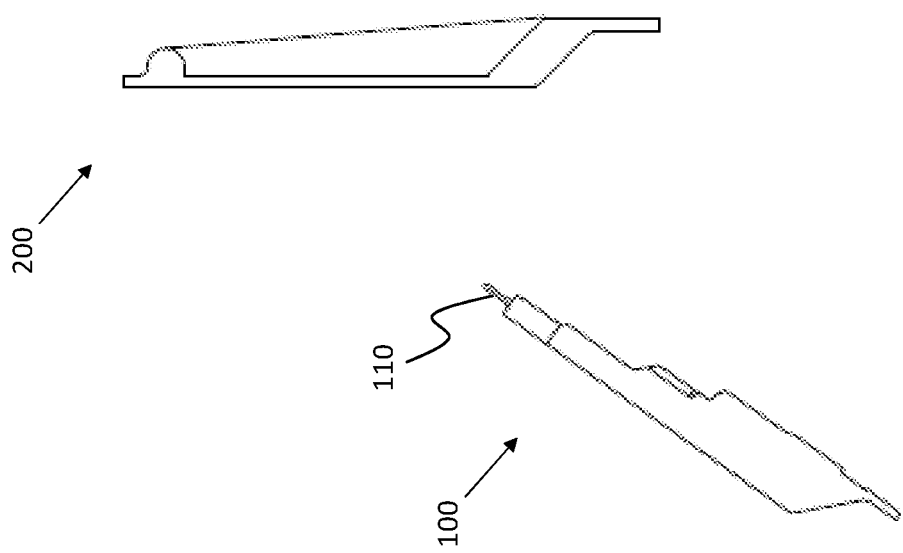
FIG. 18 shows a right side view of the monitor housing and fixture housing of FIG. 17, according to one aspect of the present disclosure.
Figure 17:
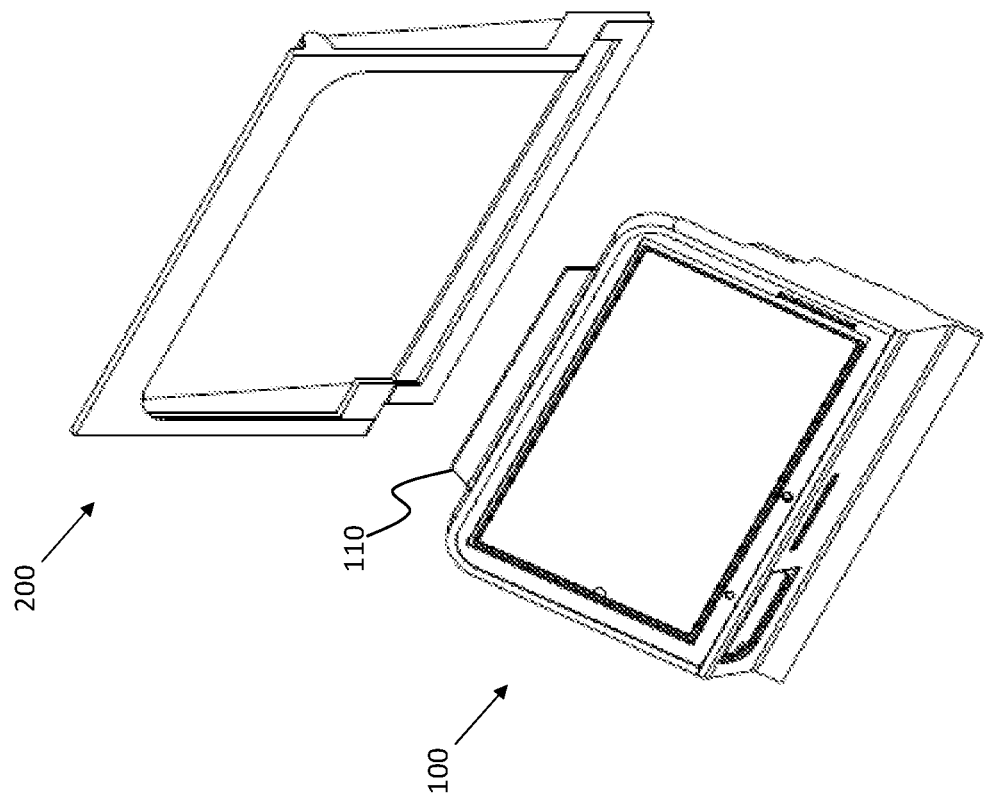
FIG. 17 shows a perspective view of the monitor housing of FIG. 1 and the fixture housing of FIG. 8, separated from one another, where the monitor housing is at an installation angle relative to the fixture housing, according to one aspect of the present disclosure.
Figure 20:
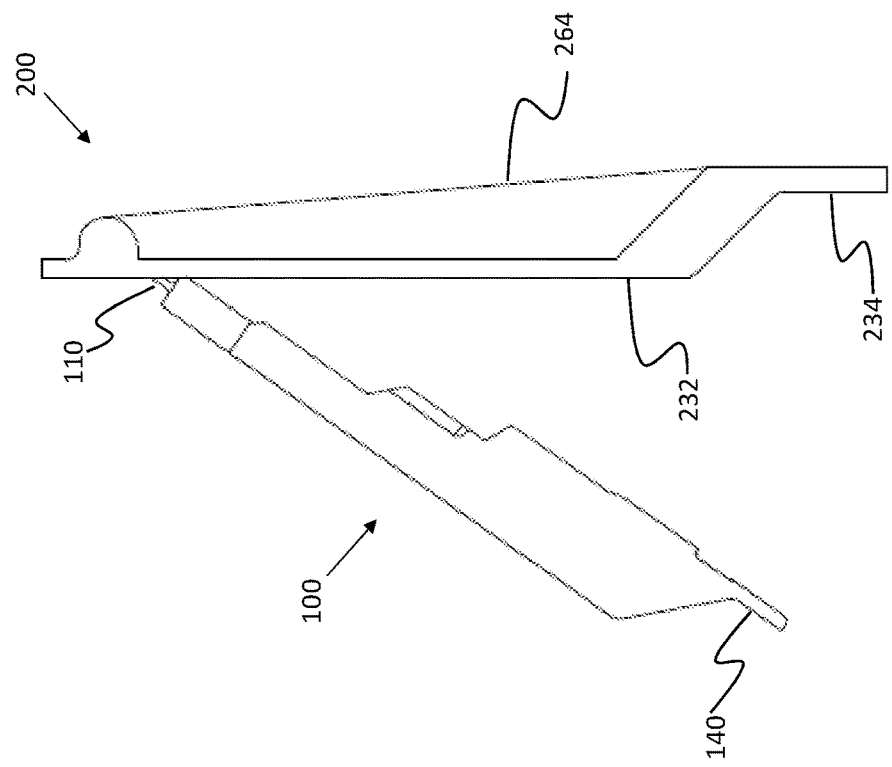
FIG. 20 shows a right side view of the monitor housing and fixture housing of FIG. 19, according to one aspect of the present disclosure.
Figure 19:
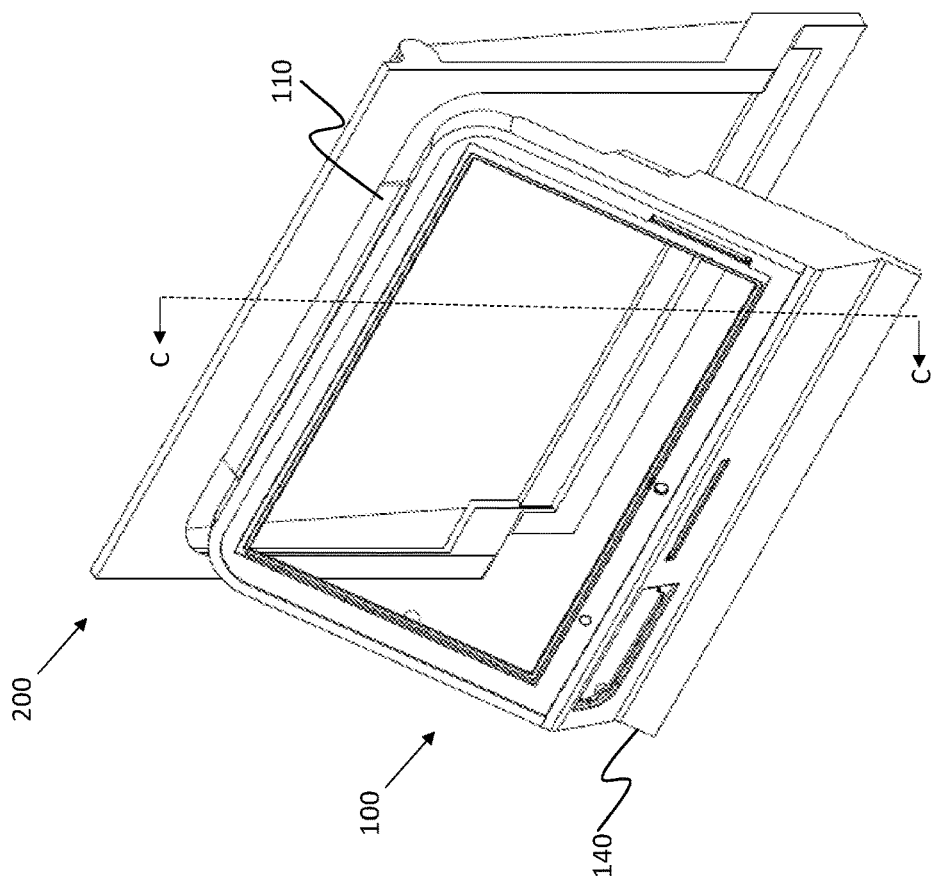
FIG. 19 shows a perspective view of the monitor housing and the fixture housing of FIG. 17, juxtaposed with one another, where the monitor housing is at an installation angle relative to the fixture housing, according to one aspect of the present disclosure.
Figure 22:
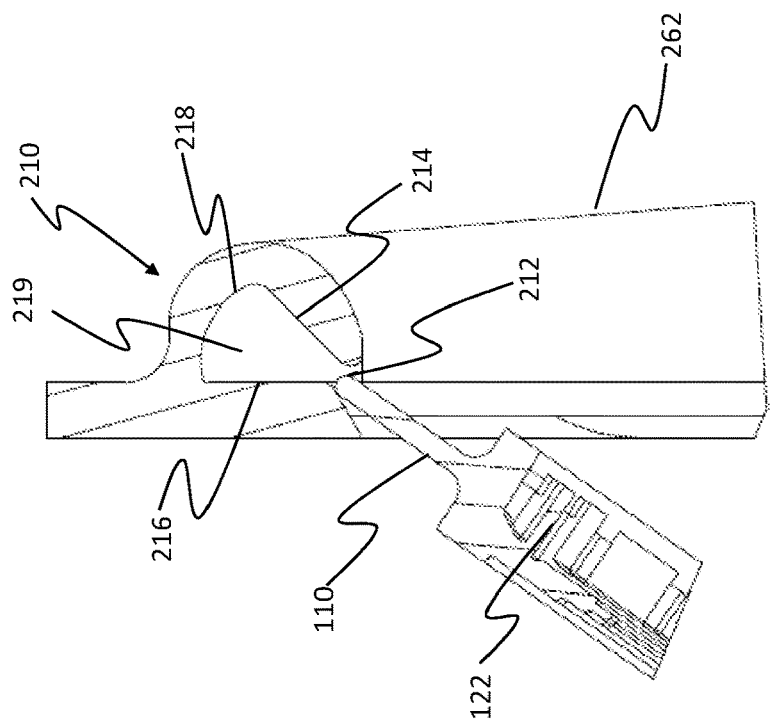
FIG. 22 shows a zoomed-in view of the female hinged groove and the tongue of FIG. 21 within the section marked D of FIG. 21, according to one aspect of the present disclosure.
Figure 21:
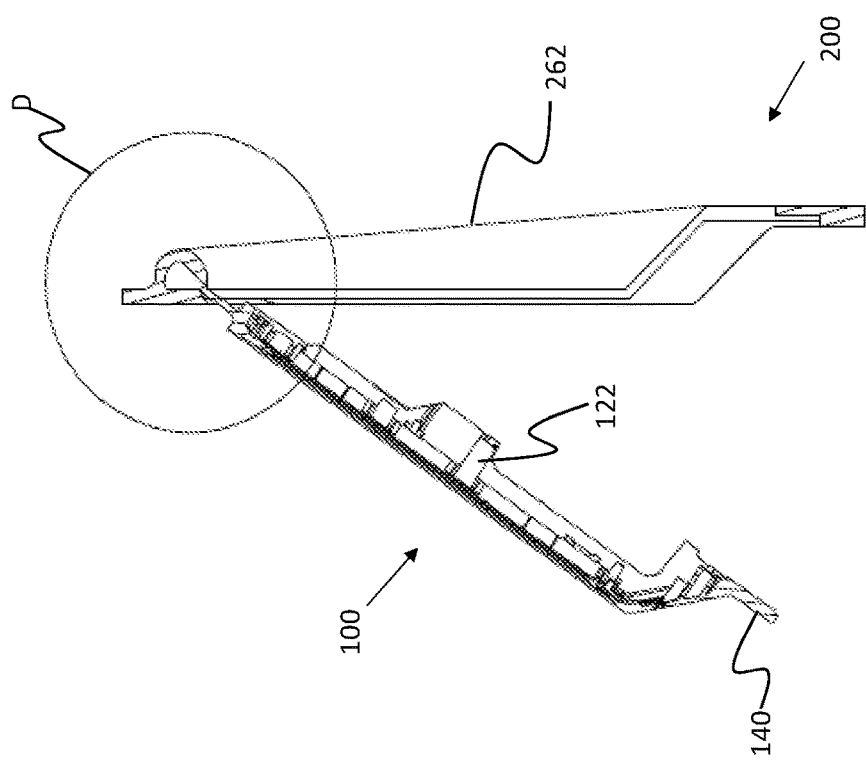
FIG. 21 shows a right cross-sectional view of the monitor housing and fixture housing of FIG. 21 across the cross-section marked C in FIG. 19, according to one aspect of the present disclosure.
Figure 24:
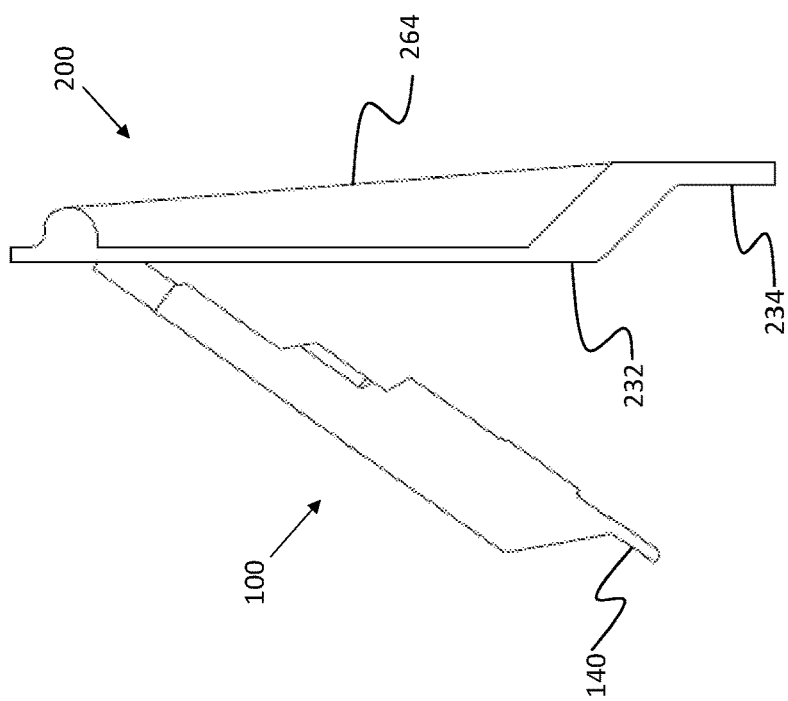
FIG. 24 shows a right side view of the monitor housing and fixture housing of FIG. 23, according to one aspect of the present disclosure.
Figure 23:
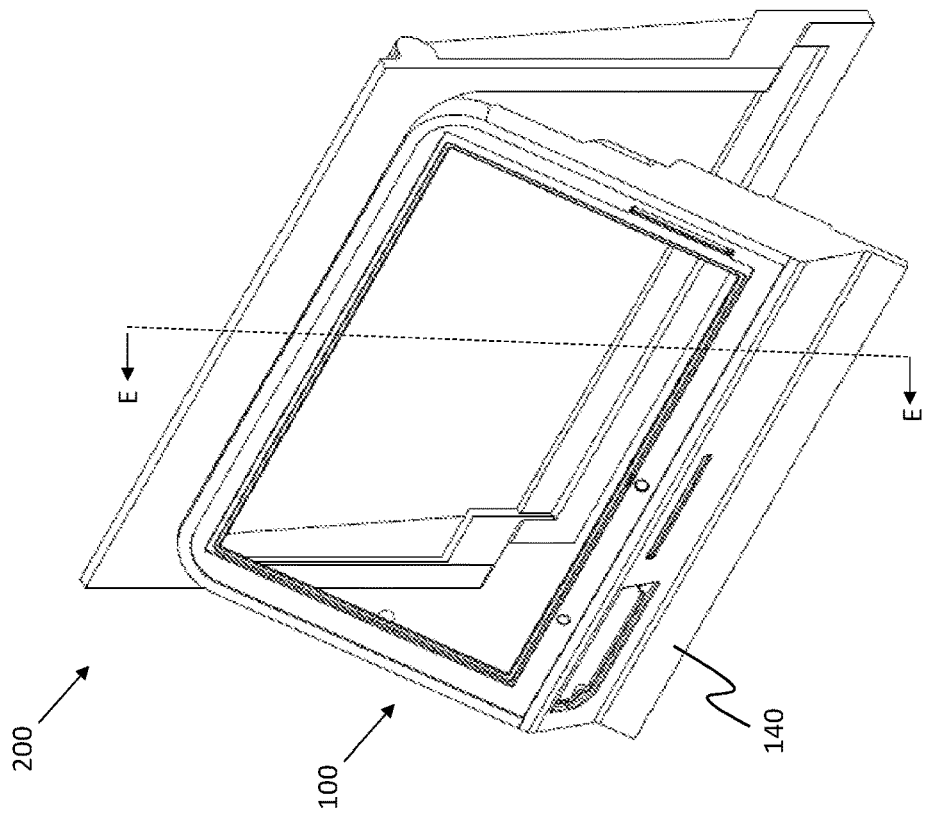
FIG. 23 shows a perspective view of the monitor housing and the fixture housing of FIG. 17, where the monitor housing is at an installation angle relative to the fixture housing, and where the tongue of the monitor housing is inserted into the female hinged groove of the fixture housing, according to one aspect of the present disclosure.

Fixture housing 200 is configured to be installed within a fixture having a non-planar surface, such as the seat of an airplane, and thus has been designed to have two separate front surfaces 232 and 234. Such a configuration allows each of front surfaces 232 and 234 to be flush with juxtaposed areas of the fixture when fixture housing 200 is installed within the non-planar fixture (not shown). However, in other embodiments where fixture housing 200 is installed within a planar surface, a front surface of fixture housing 200 could be configured to have its entire front surface configured to be on a single plane instead of multiple planes as shown in FIGS. 8 and 11.

Fixture housing 200 is also preferably formed having reinforcement ribs 262 and 264, which provide additional support along axis 239 of fixture housing 200. Providing such reinforcement ribs increases the tensile modulus of fixture housing 200 along axis 239, relative to the tensile modulus of fixture housing 200 along axis 238. Such a configuration reduces the chances of fixture housing 200 to flex along axis 239 and increases the chances of fixture housing 200 to flex along axis 238 fixture housing 200 suffer an impact. While reinforcement ribs 262 and 264 are shown here as extending in a perpendicular direction to both axis 238 and 239, reinforcement ribs 262 and 264 could extend along axis 238 in some embodiments, or could even be curved. More or less reinforcement ribs could be formed in fixture housing 200 in other embodiments.

Within the top surface of fixture housing 200, a hinged groove joint 210 has been formed, having an inner front surface 216, inner rear surface 214, inner curved surface 218, opening 212, and groove 219. Hinged groove joint 210 is configured to have a groove 219 with boundaries including inner front surface 216, inner rear surface 214, and inner curved surface 218 to receive a tongue of a monitor housing and allow its rotation through groove 219 between inner front surface 216 and inner rear surface 214. The configuration, size, and shape of hinged groove joint 210 will be explained in more detail when discussing the benefits of the hinged groove joint system as a whole.

Hinged groove joint 210 is preferably formed within an inner edge of monitor housing recess 220 with notches 272 and 274. Notches 272 and 274 effectively detach inner rear surface 214 from surrounding areas of fixture housing 200 to encourage flexion of inner rear surface 214 when a monitor housing tongue is moved to an installed position within hinged groove joint 210. The major length of groove 219 is preferably tapered, as shown by the angles of notches 272 and 274 to match a taper of a tongue of a monitor housing. By tapering groove 219 to match the tapering of a tongue of a monitor housing, the monitor housing self-aligns as it is inserted into groove 219.

Threaded holes 250 are formed within the bottom edge of monitor housing recess 220 to act as a part of a locking mechanism for an installed monitor housing, which will be explained in more detail below. While hinged groove joint 210 is formed within a topmost inner edge of monitor housing recess 220 and threaded holes 250 are formed within the bottom edge of monitor housing recess 220, the hinged groove joint and locking mechanism could be formed along any suitable portion of fixture housing 200. Preferably, the hinged groove joint is formed along an inner edge of a monitor housing recess to allow the installed monitor housing to rotate relative to the monitor housing recess, and preferably the locking mechanism is positioned opposite to the hinged groove joint relative to the monitor housing recess to maximize stability of the installed monitor housing.

Fixture housing 200 is preferably injection-molded from any lightweight, rigid material, for example plastic, but could be manufactured in any suitable manner, for example via 3-D printing, casting, machining or via assembly from discrete components. Preferably, at least the hinged groove joint 210 of fixture housing 200 is formed from a material having an equal or lower tensile modulus than the tongue of the monitor housing to encourage the hinged groove joint 210 to flex during installation, however in some embodiments the entirety of fixture housing 200 could be formed from a material having an equal or lower tensile modulus than the entirety of monitor housing 100. As used herein, materials having the same components with different proportional densities are considered different materials as their tensile moduli are different.

As shown, fixture housing 200 is substantially rectangular to conform to a monitor housing of a substantially rectangular shape, but fixture housing 200 could be formed in any suitable size and shape depending upon need.

System 300:

FIGS. 17-29 show an example of an attachment system comprising monitor housing 100 and fixture housing 200. Prior to the attachment of monitor housing 100 and fixture housing 200, preferably a monitor (not shown) is first coupled to monitor housing 100 and fixture housing 200 is first coupled to a fixture (not shown). The monitor (not shown) could be coupled to monitor housing 100 in any suitable manner, for example via screws (not shown) and threaded holes 172. Likewise, fixture housing 200 could be coupled to a fixture (not shown) in any suitable manner, for example via an adhesive lining the outside edges 230 of fixture 200, or via screws (not shown) and threaded holes 270 shown in alternative embodiment 400 of FIG. 30. The attachment means for coupling a monitor to monitor housing 100 and for coupling fixture housing 200 to a fixture could vary in number, placement, quality, and technology, depending on properties and design of the monitor and/or the fixture. Threaded attachment systems are preferred to allow for ease of maintenance of attachment system 300 over time.

Fixture housing 200 acts as a mounting bracket for monitor housing 100 to be coupled to.

Exemplary monitors and fixtures are disclosed in co-owned application U.S. patent application Ser. No. 15/894,551 to Barnes, titled "SYSTEMS AND METHODS FOR PROVIDING QUICK RELEASE OF VIDEO MONITORS FROM AN ASSEMBLY," which is incorporated by reference in its entirety. Such fixtures could include, for example, a seat, a seat back, a wall, a hand rest, a door, or a bulkhead. The fixture could be installed in any suitable environment, such as a moving vehicle (e.g. an airplane, a train, a bus, an automobile, a shipping vessel, a recreation vehicle, a trailer), a stationary building (e.g. a house, an apartment, a booth, a bunker, a skyrise), or even along an exterior surface outdoors. The portion of the fixture that fixture housing 200 is affixed to may be movable, such as a hinged surface, to allow the monitor in monitor housing 100 to be tilted relative to a user. Such embodiments are particularly useful within moving vehicles where the viewer of the monitor is belted in relative to fixture 200 for safety reasons, and may need to tilt the monitor. In other embodiments, monitor housing recess 220 may be configured to tilt relative to the outer edge 230 of fixture housing 200 to allow for the monitor to tilt relative to whatever fixture that fixture housing 200 is coupled to.

Transportation vehicles may have individualized functional equipment dedicated to a particular passenger (or crew member) seat, which can be utilized by a user accessing the display system. The functional equipment may include, but is not limited to, adjustable seats, adjustable environmental controls, adjustable lighting, telephony systems, video and/or audio entertainment systems, crew communication systems, and the like. As an example, many commercial airplanes today have individualized video and audio entertainment systems, often referred to as "inflight entertainment" or "IFE" systems. Such systems may also be referred to as "inflight entertainment and communication" systems as well, and typically abbreviated as "IFEC" systems. An example of an aircraft passenger IFE systems, include Series 2000, 3000, eFX, eX2, eXW, and/or any other inflight entertainment system developed and provided by Panasonic Avionics Corporation (without derogation of any trademark rights of Panasonic Avionics Corporation) of Lake Forest, Calif., the assignee of this application. It is noteworthy that the adaptive features of the present system is not limited to any specific IFE system or any other functionality and can be used in a broad range of applications, including vehicles in addition to aircraft, such as trains, busses, marine vessels and other vehicles, and stationary environments, such as in buildings.

To install monitor housing 100 within fixture housing 200, tongue 110 of monitor housing 100 is positioned at an installation angle 116 relative to the major surface axis 231 of fixture housing 200. Tongue 110 is inserted into hinged groove joint 210 via opening 212, and self-aligns as the tapered edges of tongue 110 touch the edges of groove 219. The matching tapered edges help to center monitor housing 100 appropriately in a rapid manner using a simple push by an installer. Once tongue 110 is at least partially inserted into fixture housing 200, monitor housing 100 can be rotated from installation angle 116 shown in FIG. 26 to installed angle 118 shown in FIGS. 27 and 28.

Opening 212 is preferably shaped such that a width of opening 212 perpendicular to installation angle 116 is larger than a width of opening 212 perpendicular to installed angle 118. By sizing opening 212 in such a way, a portion of hinged groove joint 210 will exert compressive forces upon at least a part of tongue 110 when tongue 110 is rotated to the installed angle. In FIG. 27, portion 217 of hinged groove joint 210 is flexed and provides a compressive force against tongue 110, and in FIG. 28, portion 215 of hinged groove joint 210 is flexed and provides a compressive force against tongue 110. In a preferred embodiment, the rear portion of hinged groove joint 210 flexes to prevent the front surface 232 of fixture housing 200 from distorting. Several methods of constructing fixture 200 could be employed to encourage flexion of the rear portion of hinged groove joint 210, for example by providing reinforcing ribs 262 and 264 perpendicular to hinged groove joint 210, by manufacturing portions of hinged groove joint 210 from a material having a lower tensile modulus than tongue 110, and by incorporating notches 272 and 274 on either side of recess 219.

Preferably, hinged groove joint 210 is configured to allow tongue 110 to be inserted at installation angle 116 such that tongue 110 is juxtaposed to inner rear surface 214, and rotate tongue 110 to installed angle 118 is juxtaposed to inner front surface 216. Installed angle 118 is preferably substantially parallel to front surface axis 231. Throughout the rotation between installation angle 116 and installed angle 118, tip 112 of tongue 110 is juxtaposed to inner curved surface 218. While configurations of hinged groove joint 210 may differ in size, allowing for a larger recess 219 wherein tongue 110 is not juxtaposed to inner rear surface 214 at installation angle 116, to inner front surface 216 at installed angle 118, and to inner curved surface 218 throughout the rotation movement, preferably hinged groove joint 210 is sized and disposed to the disclosed dimensions to provide boundaries of movement of tongue 110, such that the base 114 of tongue 110 acts as the pivot point for the rotation.

When tongue 110 is positioned to the installation angle 116 relative to major surface axis 231, monitor housing 100 is also positioned to installation angle 116 relative to major surface 231. When tongue 110 is rotated to installed angle 118 relative to major surface axis 231, monitor housing 100 is also rotated to installed angle 118 relative to major surface axis 231. While installation angle 116 and installed angle 118 are described herein as being relative to major surface axis 231, other reference axis' could be used with reference to the drawings and to suitable alternative embodiments. For example, tongue 110 could be disposed to extend at angles that are not parallel to front surface 132 of monitor housing 100, such as a forward-leaning angle or a rearward-leaning angle. In such embodiments, the installation angle and installed angle would be different than those depicted in FIGS. 26-28. In alternative embodiments, tongue 110 could have a curve that mates with a curve of hinged groove joint 210. Preferably, whatever the size and shape of tongue 110, hinged groove joint 210 is sized to receive tongue 110 at an installation angle, and allow tongue 110 to rotate about a pivot point, such as opening 212, such that tongue 110 rotates from an installation angle to an installed angle.

When tongue 110 is inserted into hinged groove joint 210 as far as it is able to be inserted, as tongue 110 rotates from installation angle 116 to installed angle 118, the base 140 of monitor housing 100 is preferably juxtaposed just above the upper edge of the base 240 of fixture housing 200, as shown in FIG. 29. This ensures a flush look between monitor housing 100 and fixture housing 200, and also allows a user to quickly verify that tongue 110 is fully inserted within hinged groove joint 210. If base 140 of monitor housing 100 is unable to be positioned such that a front surface of base 140 is flush with a front surface of base 240, an installer will know that tongue 110 has not been fully inserted into hinged groove joint 210, and the installation process may need to be restarted.

Once monitor housing 100 is rotated to installed angle 118, monitor housing 100 could then be locked in place to prevent rotation using any suitable locking mechanism. Here, threaded holes 150 in monitor housing 100, threaded holes 250 in fixture housing 200, and threaded screws 152 are provided to lock monitor housing 100 in place in the installed angle, to prevent monitor housing 100 from rotating away from the installed angle. Preferably, threaded screws 152 have a head with a proprietary shape. For example, the screw heads could have a shape or a # shape, or could be shaped to any logo or configuration other than standard Philips and Slot screwdriver heads commonly available on the market. Any other locking mechanism could be used to prevent monitor housing 100 from rotating away from the installed position, such as a key lock, a magnetic lock, an electronic lock, or a threaded nut and bolt. Preferably, the locking mechanism is a non-electronic, mechanical locking mechanism such that locking and unlocking of monitor housing 100 to fixture housing 100 could take place without the need for electricity.

Figure 31:
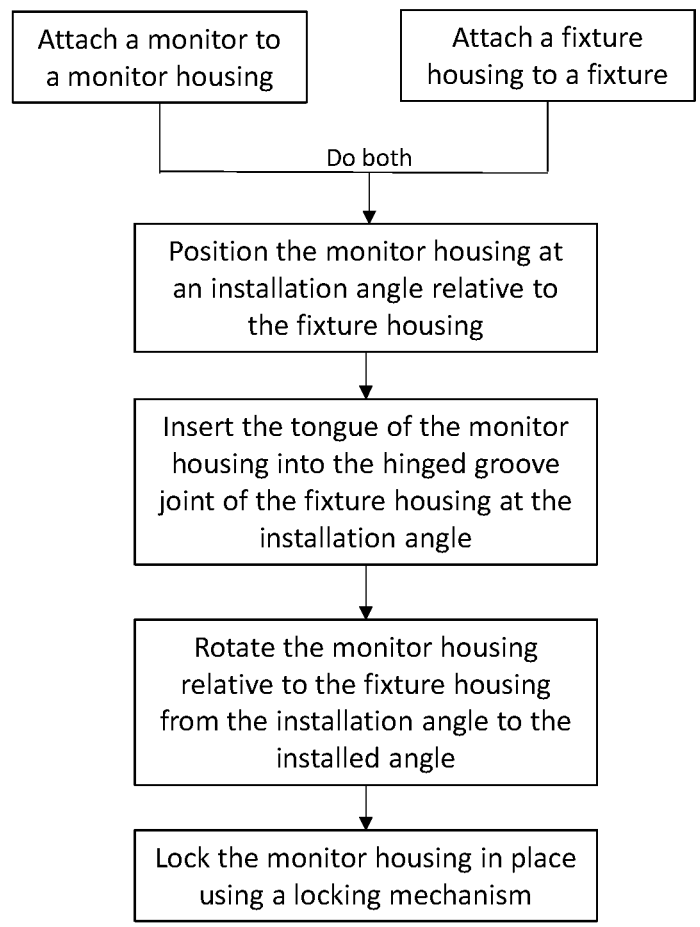
FIG. 31 shows a method of installing a monitor housing within a fixture housing, according to one aspect of the present disclosure.
Figure 32:
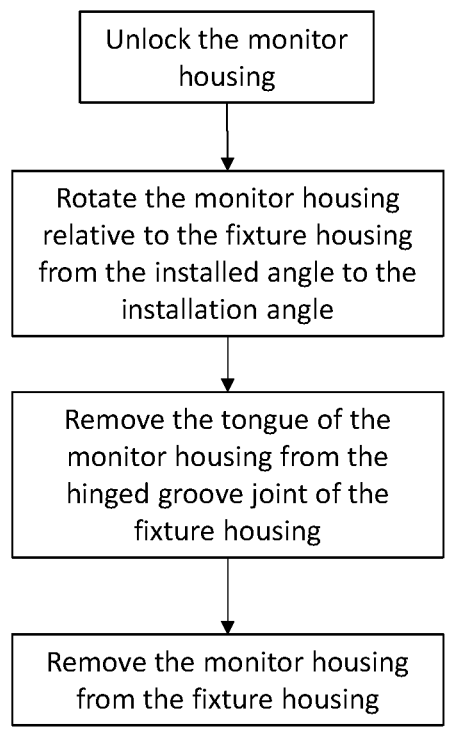
FIG. 32 shows a method of uninstalling a monitor housing from a fixture housing, according to one aspect of the present disclosure.

FIGS. 31 and 32 illustrate exemplary methods of installing and uninstalling a monitor to a fixture using inventive monitor housings and monitors. (Exemplary as used herein means as an example and not necessarily the best way). The monitor should be coupled to the monitor housing and the fixture should be coupled to the fixture housing before the monitor and fixture are indirectly coupled to one another through both housings. The monitor housing should be positioned at an installation angle relative to the fixture housing, such as installation angle 116 relative to major surface axis 231, and then the monitor housing's tongue can be inserted into the fixture housing's hinged groove joint. The monitor housing can then be rotated from the installation angle to the installed angle before the monitor housing is locked in place to prevent it from being rotated away from the installed angle.

In some embodiments, before the monitor housing's tongue is inserted into the fixture housing's hinged groove joint, simple maintenance can be performed on the monitor within the monitor housing, for example connections could be made or checked between input and/or output terminals of the monitor and input and/or output terminals of the fixture.

Rapid maintenance to the monitor, or rapid replacement of the monitor, could be performed simply by unlocking the monitor housing from the fixture housing, rotating the monitor housing from the installed angle to the installation angle, and removing the tongue of the monitor housing from the hinged groove joint. From this position, terminals and ports of the monitor could be easily accessed without removing the monitor from the monitor housing, and the monitor could even be rapidly replaced by replacing the monitor, or preferably by replacing the entire monitor housing with a new, fungible, monitor housing having a new monitor.

Thus, innovative technology for a monitor attachment system has been described. Note that references throughout this specification to "one aspect" (or "embodiment") or "an aspect" mean that a particular feature, structure or characteristic described in connection with the aspect is included in at least one aspect of the present disclosure. Therefore, it is emphasized and should be appreciated that two or more references to "an aspect" or "one aspect" or "an alternative aspect" in various portions of this specification are not necessarily all referring to the same aspect. Furthermore, the particular features, structures or characteristics being referred to may be combined as suitable in one or more aspects of the disclosure, as will be recognized by those of ordinary skill in the art.

While the present disclosure is described above with respect to what is currently considered its preferred aspects, it is to be understood that the disclosure is not limited to that described above. To the contrary, the disclosure is intended to cover various modifications and equivalent arrangements within the spirit and scope of the appended claims.

What is claimed is:

1. An attachment system for coupling a monitor to a fixture, the attachment system comprising:
   a fixture housing including a monitor housing recess and a hinged groove joint;
   a monitor housing including a tongue; and
   a locking mechanism,
      wherein a portion of the monitor housing is configured to fit within the monitor housing recess,
      wherein the tongue is configured to rotate within the hinged groove joint between an installation angle and an installed angle,
      wherein the locking mechanism has a locked state that prevents the tongue from rotating from the installed angle to the installation angle and an unlocked state that allows the tongue to rotate from the installed angle to the installation angle;
      wherein an inner perimeter of the monitor housing recess is configured to abut an outer perimeter of the portion of the monitor housing when the tongue is rotated to the installed angle.

2. The attachment system of claim 1, wherein the tongue has a tip width and a base width, wherein the tip width is less than the base width.

3. The attachment system of claim 2, wherein the base width tapers to the tip width.

4. The attachment system of claim 1, wherein the fixture housing further comprises a reinforcement rib along a first axis to increase strength of the fixture housing along the first axis relative to the strength of the fixture housing along a second axis perpendicular to the first axis.

5. The attachment system of claim 1, wherein the locking mechanism is disposed on a side of the fixture housing opposite the hinged groove joint and on a side of the monitor housing opposite the tongue.

6. An attachment system for coupling a monitor to a fixture, the attachment system comprising:
   a fixture housing including a monitor housing recess and a hinged groove joint;
   a monitor housing including a tongue; and
   a locking mechanism,
      wherein a portion of the monitor housing is configured to fit within the monitor housing recess,
      wherein the tongue is configured to rotate within the hinged groove joint between an installation angle and an installed angle,
      wherein the locking mechanism has a locked state that prevents the tongue from rotating from the installed angle to the installation angle and an unlocked state that allows the tongue to rotate from the installed angle to the installation angle,
      wherein the hinged groove joint has an opening width perpendicular to the installation angle greater than a width of the tongue, and an opening width perpendicular to the installed angle less than the width of the tongue.

7. The attachment system of claim 6, wherein the hinged groove joint comprises a first material that flexes when the tongue is rotated from the installation angle to the installed angle.

8. The attachment system of claim 7, wherein the tongue comprises a second material having an equal or higher tensile modulus than the first material.

9. The attachment system of claim 6, wherein the fixture housing comprises notches on both sides of the hinged groove joint.

10. The attachment system of claim 6, wherein the fixture housing further comprises a reinforcement rib along a first axis to increase strength of the fixture housing along the first axis relative to the strength of the fixture housing along a second axis perpendicular to the first axis.

11. The attachment system of claim 6, wherein the locking mechanism is disposed on a side of the fixture housing opposite the hinged groove joint and on a side of the monitor housing opposite the tongue.

12. The attachment system of claim 6, wherein the tongue has a tip width and a base width, wherein the tip width is less than the base width.

13. The attachment system of claim 12, wherein the base width tapers to the tip width.

14. A method for coupling a monitor to a fixture, comprising:

coupling a first monitor to a first monitor housing;
coupling a fixture housing to a fixture;
inserting a first tongue of the first monitor housing into a hinged groove joint of the fixture housing at an installation angle;
rotating the first monitor housing relative to the fixture housing to move the first tongue of the first monitor housing from the installation angle to an installed angle within the hinged groove joint;
locking a first locking mechanism to a portion of the first monitor housing and a portion of the fixture housing to prevent the first tongue from rotating from the installed angle to the installation angle; and
tapering the first tongue to match a taper of the hinged groove joint, wherein inserting the tongue of the monitor housing at an installed angle within the hinged groove joint aligns the monitor housing relative to the fixture housing via the matched tapering.

15. The method of claim 14, further comprising: flexing at an flexion point of the hinged groove joint when rotating the first monitor housing relative to the fixture housing to provide a compressive force against the first tongue of the monitor housing.

16. The method of claim 14, further comprising:
coupling a second monitor to a second monitor housing;
unlocking the first locking mechanism;
rotating the first monitor housing relative to the fixture housing to move the first tongue of the monitor housing from the installed angle to an installation angle within the hinged groove joint;
removing the first tongue of the first monitor housing from the hinged groove joint of the fixture housing at the installation angle;
inserting a second tongue of the second monitor housing into the hinged groove joint of the fixture housing at the installation angle;
rotating the second monitor housing relative to the fixture housing to move the second tongue of the second monitor housing from the installation angle to the installed angle within the hinged groove joint; and
locking a second locking mechanism to a portion of the second monitor housing and the portion of the fixture housing to prevent the second tongue from rotating from the installed angle to the installation angle.

17. The method of claim 14, wherein locking a first locking mechanism comprises threading a screw through a hole in the first monitor housing and a hole in the fixture housing.

18. A flush-mount system for coupling a monitor to a fixture, the flush-mount system comprising:
a fixture housing comprising a first side having a fixture hinged joint assembly and a fixture attachment mechanism that couples the fixture housing to a fixture, and a second side having a fixture locking mechanism; and
a monitor housing comprising a first side having a monitor hinged joint assembly and a monitor attachment mechanism that couples a monitor to the monitor housing, and a second side having a monitor locking mechanism
wherein the fixture hinged joint assembly and the monitor hinged joint assembly are configured to enable engagement and disengagement at an installation angle relative to one another, are configured to prevent disengagement of the monitor housing and the fixture housing at an installed angle relative to one another, and are configured to enable rotation of the monitor housing relative to the fixture housing between the installation angle and the installed angle,
wherein the monitor housing has a front planar surface that is flush with a front planar surface of the fixture housing when the monitor housing is rotated to the installed angle;
wherein the fixture housing and the monitor housing are configured to mate in a locked state to prevent the monitor housing from rotating relative to the fixture housing about the hinged joint assembly;
wherein the fixture locking mechanism comprises a fixture housing threaded hole, and wherein the monitor locking mechanism comprises a monitor housing threaded hole and a threaded screw that threads through the monitor housing threaded hole and the fixture housing threaded hole.

19. The flush-mount system of claim 18, wherein the threaded screw has a non-standard, shaped head.

20. The flush-mount system of claim 18,
wherein the monitor housing comprises a first edge having a first elasticity,
wherein the fixture housing comprises a second edge having a second elasticity,
wherein the first edge and the second edge are parallel to one another when the monitor housing is rotated to the installed angle, and
wherein the first elasticity is greater than or equal to the second elasticity.

* * * * *